(12) United States Patent
Banik, II et al.

(10) Patent No.: US 10,781,527 B2
(45) Date of Patent: Sep. 22, 2020

(54) METHODS AND APPARATUS FOR CONTROLLING DELIVERY OF CROSS FLOWING AND IMPINGING ELECTROLYTE DURING ELECTROPLATING

(71) Applicant: Lam Research Corporation, Fremont, CA (US)

(72) Inventors: Stephen J. Banik, II, Portland, OR (US); Aaron Berke, Portland, OR (US); Bryan L. Buckalew, Tualatin, OR (US); Robert Rash, West Linn, OR (US)

(73) Assignee: Lam Research Corporation, Fremont, CA (US)

( * ) Notice: Subject to any disclaimer, the term of this patent is extended or adjusted under 35 U.S.C. 154(b) by 38 days.

(21) Appl. No.: 15/707,805

(22) Filed: Sep. 18, 2017

(65) Prior Publication Data

US 2019/0085479 A1    Mar. 21, 2019

(51) Int. Cl.
*C25B 9/08* (2006.01)
*C25B 15/08* (2006.01)
(Continued)

(52) U.S. Cl.
CPC ............ *C25D 5/08* (2013.01); *C25D 7/12* (2013.01); *C25D 17/001* (2013.01);
(Continued)

(58) Field of Classification Search
CPC .. C25B 9/08; C25B 15/08; C25B 9/10; C25B 1/10; C25B 9/00; C25B 9/18; C25B 9/02
(Continued)

(56) References Cited

U.S. PATENT DOCUMENTS 3,652,442 A    3/1972 Powers et al.
3,706,651 A    12/1972 Leland
(Continued)

FOREIGN PATENT DOCUMENTS

CN    1353778 A    6/2002
CN    1463467 A    12/2003
(Continued)

OTHER PUBLICATIONS

U.S. Office Action dated Oct. 26, 2007 issued in U.S. Appl. No. 11/040,359.
(Continued)

*Primary Examiner* — Zulmariam Mendez
(74) *Attorney, Agent, or Firm* — Weaver Austin Villeneuve & Sampson LLP

(57) ABSTRACT

Various embodiments herein relate to methods and apparatus for electroplating material onto a semiconductor substrate. The apparatus includes an ionically resistive element that separates the plating chamber into a cross flow manifold (above the ionically resistive element) and an ionically resistive element manifold (below the ionically resistive element). Electrolyte is delivered to the cross flow manifold, where it shears over the surface of the substrate, and to the ionically resistive element manifold, where it passes through through-holes in the ionically resistive element to impinge upon the substrate as it enters the cross flow manifold. In certain embodiments, the flow of electrolyte into the cross flow manifold (e.g., through a side inlet) and the flow of electrolyte into the ionically resistive element manifold are actively controlled, e.g., using a three-way valve. In these or other cases, the ionically resistive element may include electrolyte jets.

13 Claims, 10 Drawing Sheets

(51) Int. Cl.
*C25B 1/10* (2006.01)
*C25B 9/18* (2006.01)
*C25D 5/08* (2006.01)
*C25D 17/00* (2006.01)
*C25D 7/12* (2006.01)
*C25D 21/12* (2006.01)
*H01L 23/00* (2006.01)
*H01L 21/768* (2006.01)
*H01L 21/288* (2006.01)

(52) U.S. Cl.
CPC ......... *C25D 17/002* (2013.01); *C25D 17/008* (2013.01); *C25D 21/12* (2013.01); *H01L 24/742* (2013.01); *H01L 21/2885* (2013.01); *H01L 21/76898* (2013.01); *H01L 24/11* (2013.01); *H01L 24/13* (2013.01); *H01L 2224/11462* (2013.01); *H01L 2224/13111* (2013.01); *H01L 2224/13147* (2013.01); *H01L 2224/13155* (2013.01); *H01L 2224/94* (2013.01)

(58) Field of Classification Search
USPC ....................................................... 204/263
See application file for complete search history.

(56) References Cited

U.S. PATENT DOCUMENTS

| | | |
|---|---|---|
| 3,862,891 A | 1/1975 | Smith |
| 4,033,833 A | 7/1977 | Bestel et al. |
| 4,082,638 A | 4/1978 | Jumer |
| 4,240,886 A | 12/1980 | Hodges et al. |
| 4,272,335 A | 6/1981 | Combs |
| 4,304,641 A | 12/1981 | Grandia et al. |
| 4,427,520 A | 1/1984 | Bahnsen et al. |
| 4,469,564 A | 9/1984 | Okinaka et al. |
| 4,545,877 A | 10/1985 | Hillis |
| 4,604,177 A | 8/1986 | Sivilotti |
| 4,604,178 A | 8/1986 | Flegener et al. |
| 4,605,482 A | 8/1986 | Shirgami et al. |
| 4,633,893 A | 1/1987 | McConnell |
| 4,696,729 A | 9/1987 | Santini |
| 4,738,272 A | 4/1988 | McConnell |
| 4,828,654 A | 5/1989 | Reed |
| 4,856,544 A | 8/1989 | McConnell |
| 4,906,346 A | 3/1990 | Hadersbeck et al. |
| 4,931,149 A | 6/1990 | Stierman et al. |
| 4,933,061 A | 6/1990 | Kulkarni et al. |
| 5,039,381 A | 8/1991 | Mullarkey |
| 5,078,852 A | 1/1992 | Yee et al. |
| 5,096,550 A | 3/1992 | Mayer et al. |
| 5,146,136 A | 9/1992 | Ogura et al. |
| 5,156,730 A | 10/1992 | Bhatt et al. |
| 5,162,079 A | 11/1992 | Brown |
| 5,217,586 A | 6/1993 | Datta et al. |
| 5,316,642 A | 5/1994 | Young, Jr. et al. |
| 5,368,711 A | 11/1994 | Poris |
| 5,391,285 A | 2/1995 | Lytle et al. |
| 5,421,987 A | 6/1995 | Tzanavaras et al. |
| 5,443,707 A | 8/1995 | Mori |
| 5,472,592 A | 12/1995 | Lowery |
| 5,476,578 A | 12/1995 | Forand |
| 5,498,325 A | 3/1996 | Nishimura et al. |
| 5,516,412 A | 5/1996 | Andricacos et al. |
| 5,567,300 A | 10/1996 | Datta et al. |
| 5,660,699 A | 8/1997 | Saito et al. |
| 5,723,028 A | 3/1998 | Poris |
| 5,744,019 A | 4/1998 | Ang |
| 5,935,402 A | 8/1999 | Fanti |
| 6,004,440 A | 12/1999 | Hanson et al. |
| 6,022,465 A | 2/2000 | Ting et al. |
| 6,027,631 A | 2/2000 | Broadbent |
| 6,080,291 A | 6/2000 | Woodruff et al. |
| 6,106,687 A | 8/2000 | Edelstein |
| 6,126,798 A | 10/2000 | Reid et al. |
| 6,132,587 A | 10/2000 | Jorne et al. |
| 6,132,805 A | 10/2000 | Moslehi |
| 6,179,983 B1 | 1/2001 | Reid et al. |
| 6,193,860 B1 | 2/2001 | Weling |
| 6,228,231 B1 | 5/2001 | Uzoh |
| 6,251,255 B1 | 6/2001 | Copping et al. |
| 6,254,742 B1 | 7/2001 | Hanson et al. |
| 6,261,433 B1 | 7/2001 | Landau |
| 6,368,475 B1 | 4/2002 | Hanson et al. |
| 6,391,166 B1 | 5/2002 | Wang |
| 6,391,188 B1 | 5/2002 | Goosey |
| 6,395,152 B1 | 5/2002 | Wang |
| 6,398,926 B1 | 6/2002 | Mahneke |
| 6,402,923 B1 | 6/2002 | Mayer et al. |
| 6,431,908 B1 | 8/2002 | Beck et al. |
| 6,454,918 B1 | 9/2002 | Sakaki |
| 6,497,801 B1 | 12/2002 | Woodruff et al. |
| 6,514,570 B1 | 2/2003 | Matsuyama et al. |
| 6,521,102 B1 | 2/2003 | Dordi |
| 6,527,920 B1 | 3/2003 | Jackson et al. |
| 6,551,483 B1 | 4/2003 | Mayer et al. |
| 6,627,051 B2 | 9/2003 | Berner et al. |
| 6,632,335 B2 | 10/2003 | Kunisawa et al. |
| 6,755,946 B1 | 6/2004 | Patton et al. |
| 6,755,954 B2 | 6/2004 | Mayer et al. |
| 6,773,571 B1 | 8/2004 | Mayer et al. |
| 6,800,187 B1 | 10/2004 | Reid et al. |
| 6,821,407 B1 | 11/2004 | Reid et al. |
| 6,843,855 B2 | 1/2005 | Verhaverbeke |
| 6,869,515 B2 | 3/2005 | Cohen |
| 6,890,416 B1 | 5/2005 | Mayer et al. |
| 6,919,010 B1 | 7/2005 | Mayer et al. |
| 6,921,468 B2 | 7/2005 | Graham et al. |
| 6,964,792 B1 | 11/2005 | Mayer et al. |
| 7,070,686 B2 | 7/2006 | Contolini et al. |
| 7,169,705 B2 | 1/2007 | Ide et al. |
| D544,452 S | 6/2007 | Nakamura et al. |
| D548,705 S | 8/2007 | Hayashi |
| D552,565 S | 10/2007 | Nakamura et al. |
| D553,104 S | 10/2007 | Oohashi et al. |
| 7,387,131 B2 | 6/2008 | Kuroda et al. |
| D587,222 S | 2/2009 | Sasaki et al. |
| 7,622,024 B1 | 11/2009 | Mayer et al. |
| 7,641,776 B2 | 1/2010 | Nagar et al. |
| D609,652 S | 2/2010 | Nagasaka et al. |
| D609,655 S | 2/2010 | Sugimoto |
| 7,670,465 B2 | 3/2010 | Yang et al. |
| D614,593 S | 4/2010 | Lee et al. |
| 7,837,841 B2 | 11/2010 | Chen et al. |
| 7,854,828 B2 | 12/2010 | Reid et al. |
| 7,935,240 B2 | 5/2011 | Singh et al. |
| 7,967,969 B2 | 6/2011 | Mayer et al. |
| D648,289 S | 11/2011 | Mayer et al. |
| 8,262,871 B1 | 9/2012 | Mayer et al. |
| 8,308,931 B2 | 11/2012 | Reid et al. |
| 8,623,193 B1 | 1/2014 | Mayer et al. |
| 8,795,480 B2 | 8/2014 | Mayer et al. |
| 9,394,620 B2 | 7/2016 | Mayer et al. |
| 9,449,808 B2 | 9/2016 | Buckalew et al. |
| 9,464,361 B2 | 10/2016 | Mayer et al. |
| 9,523,155 B2 | 12/2016 | Mayer et al. |
| 9,624,592 B2 | 4/2017 | Abraham et al. |
| 9,677,190 B2 | 6/2017 | Kim et al. |
| 9,834,852 B2 | 12/2017 | Mayer et al. |
| 9,899,230 B2 | 2/2018 | Buckalew et al. |
| 10,094,034 B2 | 10/2018 | Graham et al. |
| 10,190,230 B2 | 1/2019 | Abraham et al. |
| 10,233,556 B2 | 3/2019 | Graham et al. |
| 10,364,505 B2 | 7/2019 | Thorkelsson et al. |
| 10,662,545 B2 | 5/2020 | Mayer et al. |
| 2002/0017456 A1 | 2/2002 | Graham et al. |
| 2002/0062839 A1 | 5/2002 | Verhaverbeke et al. |
| 2002/0066464 A1 | 6/2002 | Bergman |
| 2002/0084189 A1 | 7/2002 | Wang et al. |
| 2002/0088708 A1 | 7/2002 | Sakaki |
| 2002/0119671 A1 | 8/2002 | Lee |
| 2002/0125141 A1 | 9/2002 | Wilson et al. |
| 2002/0164840 A1 | 11/2002 | Lu et al. |

(56) References Cited

U.S. PATENT DOCUMENTS

| | | |
|---|---|---|
| 2002/0166773 A1 | 11/2002 | Cohen |
| 2003/0017647 A1 | 1/2003 | Kwon et al. |
| 2003/0019755 A1 | 1/2003 | Hey et al. |
| 2003/0029527 A1 | 2/2003 | Yajima et al. |
| 2003/0038035 A1 | 2/2003 | Wilson et al. |
| 2003/0075451 A1 | 4/2003 | Kanda |
| 2003/0102210 A1 | 6/2003 | Woodruff et al. |
| 2003/0201166 A1 | 10/2003 | Zheng et al. |
| 2004/0000487 A1 | 1/2004 | Bonkass et al. |
| 2004/0053147 A1 | 3/2004 | Ito |
| 2004/0084301 A1 | 5/2004 | Dordi et al. |
| 2004/0118694 A1 | 6/2004 | Yang et al. |
| 2004/0149584 A1 | 8/2004 | Nagai et al. |
| 2004/0163963 A1 | 8/2004 | Uzoh et al. |
| 2004/0168926 A1 | 9/2004 | Basol et al. |
| 2004/0231989 A1 | 11/2004 | Kobata et al. |
| 2004/0256238 A1 | 12/2004 | Suzuki et al. |
| 2005/0003737 A1 | 1/2005 | Montierth et al. |
| 2005/0045488 A1 | 3/2005 | Paneccasio et al. |
| 2005/0053874 A1 | 3/2005 | Yoshihara et al. |
| 2005/0056538 A1 | 3/2005 | Kovarsky et al. |
| 2005/0145482 A1 | 7/2005 | Suzuki et al. |
| 2005/0145499 A1 | 7/2005 | Kovarsky et al. |
| 2005/0161336 A1 | 7/2005 | Woodruff et al. |
| 2005/0181252 A1 | 8/2005 | Risen et al. |
| 2005/0205429 A1 | 9/2005 | Gebhart et al. |
| 2006/0038182 A1 | 2/2006 | Rogers et al. |
| 2006/0054181 A1 | 3/2006 | Rayandayan et al. |
| 2006/0243598 A1 | 11/2006 | Singh et al. |
| 2007/0015080 A1 | 1/2007 | Toukhy et al. |
| 2007/0029193 A1 | 2/2007 | Brcka |
| 2007/0068819 A1 | 3/2007 | Singh et al. |
| 2010/0032303 A1 | 2/2010 | Reid et al. |
| 2010/0032304 A1 | 2/2010 | Mayer et al. |
| 2010/0032310 A1 | 2/2010 | Reid et al. |
| 2010/0035192 A1 | 2/2010 | Ando et al. |
| 2010/0044236 A1 | 2/2010 | Mayer et al. |
| 2010/0116672 A1 | 5/2010 | Mayer et al. |
| 2010/0243462 A1 | 9/2010 | Cohen |
| 2011/0031112 A1 | 2/2011 | Birang et al. |
| 2012/0000786 A1 | 1/2012 | Mayer et al. |
| 2012/0104350 A1 | 5/2012 | Himeno et al. |
| 2012/0258408 A1 | 10/2012 | Mayer et al. |
| 2012/0261254 A1 | 10/2012 | Reid et al. |
| 2013/0137242 A1 | 5/2013 | He et al. |
| 2013/0313123 A1 | 11/2013 | Abraham et al. |
| 2014/0183049 A1 | 7/2014 | Mayer et al. |
| 2014/0216940 A1 | 8/2014 | Wang et al. |
| 2014/0299476 A1 | 10/2014 | Yasuda et al. |
| 2014/0299477 A1 | 10/2014 | Mayer et al. |
| 2014/0299478 A1 | 10/2014 | Mayer et al. |
| 2014/0357089 A1 | 12/2014 | Buckalew et al. |
| 2015/0129418 A1 | 5/2015 | Keigler et al. |
| 2016/0002076 A1* | 1/2016 | Jha ..................... C02F 1/469 204/520 |
| 2016/0215408 A1 | 7/2016 | Kagajwala et al. |
| 2016/0265132 A1 | 9/2016 | Graham et al. |
| 2016/0273119 A1 | 9/2016 | He et al. |
| 2016/0343582 A1 | 11/2016 | Buckalew et al. |
| 2016/0376722 A1 | 12/2016 | Mayer et al. |
| 2017/0029973 A1 | 2/2017 | Mayer et al. |
| 2017/0058417 A1 | 3/2017 | Graham et al. |
| 2017/0175286 A1 | 6/2017 | Abraham et al. |
| 2017/0342583 A1 | 11/2017 | Thorkelsson et al. |
| 2017/0342590 A1 | 11/2017 | Thorkelsson et al. |
| 2018/0105949 A1 | 4/2018 | Mayer et al. |
| 2018/0258546 A1 | 9/2018 | Graham et al. |
| 2019/0055665 A1 | 2/2019 | Banik, II et al. |
| 2019/0301042 A1 | 10/2019 | Thorkelsson et al. |

FOREIGN PATENT DOCUMENTS

| | | |
|---|---|---|
| CN | 1551931 | 12/2004 |
| CN | 101056718 A | 10/2007 |
| CN | 101220500 A | 7/2008 |
| CN | 101736376 A | 6/2010 |
| CN | 102330140 A | 1/2012 |
| CN | 201130081716.6 | 4/2012 |
| CN | 102459717 A | 5/2012 |
| CN | 102719865 A | 10/2012 |
| CN | 102732924 A | 10/2012 |
| CN | 103866374 A | 6/2014 |
| EP | 0 037 325 | 3/1981 |
| EP | 0 233 184 | 8/1987 |
| EP | 1 391 540 | 2/2004 |
| EP | 1 538 662 | 6/2005 |
| GB | 2 176 908 | 1/1987 |
| GB | 2 206 733 | 1/1989 |
| JP | 59-162298 | 9/1984 |
| JP | 09-53197 | 2/1997 |
| JP | 10-036997 A | 10/1998 |
| JP | 2000-87299 A | 3/2000 |
| JP | 2001-064795 A | 3/2001 |
| JP | 2001-316887 | 11/2001 |
| JP | 2002-289568 | 10/2002 |
| JP | 2003-268591 | 9/2003 |
| JP | 2004-068158 A | 3/2004 |
| JP | 2004-250785 A | 9/2004 |
| JP | 2005-344133 A | 12/2005 |
| KR | 10-2006-0048645 A | 5/2006 |
| KR | 10-0707121 | 4/2007 |
| KR | 10-2012-0003405 A | 1/2012 |
| KR | 10-2012-0029468 A | 3/2012 |
| KR | 0657600 | 8/2012 |
| TW | 200302519 | 8/2003 |
| TW | 591122 B | 6/2004 |
| TW | 201204877 A1 | 2/2012 |
| TW | D148167 | 7/2012 |
| TW | 201313968 A1 | 4/2013 |
| TW | 201437439 A | 10/2014 |
| WO | WO 87/00094 | 1/1987 |
| WO | WO 1999/041434 | 8/1999 |
| WO | WO 00/61837 | 10/2000 |
| WO | WO 01/68952 A1 | 9/2001 |
| WO | WO 02/01609 | 1/2002 |
| WO | WO 2003/018879 | 6/2003 |
| WO | WO 2004/114372 | 12/2004 |
| WO | WO 2007/128659 | 11/2007 |
| WO | WO 2010/144330 | 12/2010 |

OTHER PUBLICATIONS

U.S. Final Office Action dated Jul. 25, 2008 issued in U.S. Appl. No. 11/040,359.
U.S. Office Action dated Jan. 8, 2009 issued in U.S. Appl. No. 11/040,359.
U.S. Notice of Allowance dated Jul. 20, 2009 issued in U.S. Appl. No. 11/040,359.
U.S. Office Action dated Oct. 6, 2010 issued in U.S. Appl. No. 12/578,310.
U.S. Notice of Allowance dated Mar. 4, 2011 issued in U.S. Appl. No. 12/578,310.
U.S. Office Action dated Oct. 5, 2012 issued in U.S. Appl. No. 13/110,759.
U.S. Office Action dated Sep. 19, 2011 issued in U.S. Appl. No. 12/291,356.
U.S. Final Office Action dated Feb. 27, 2012 issued in U.S. Appl. No. 12/291,356.
U.S. Notice of Allowance dated Jul. 27, 2012 issued in U.S. Appl. No. 12/291,356.
U.S. Office Action dated Jun. 24, 2011 issued in U.S. Appl. No. 12/481,503.
U.S. Final Office Action dated Mar. 1, 2012 issued in U.S. Appl. No. 12/481,503.
U.S. Office Action dated Jul. 9, 2012 issued in U.S. Appl. No. 12/481,503.
U.S. Final Office Action dated Dec. 19, 2012 issued in U.S. Appl. No. 12/481,503.
U.S. Office Action dated Jun. 24, 2011 issued in U.S. Appl. No. 12/606,030.

(56) References Cited

OTHER PUBLICATIONS

U.S. Final Office Action dated Mar. 1, 2012 issued in U.S. Appl. No. 12/606,030.
U.S. Office Action dated Jul. 13, 2012 issued in U.S. Appl. No. 12/606,030.
U.S. Final Office Action dated Dec. 17, 2012 issued in U.S. Appl. No. 12/606,030.
U.S. Notice of Allowance dated Aug. 10, 2011 issued in Design U.S. Appl. No. 29/377,521.
U.S. Office Action dated Jun. 26, 2013 issued in U.S. Appl. No. 13/172,642.
U.S. Final Office Action dated Jan. 15, 2014 issued in U.S. Appl. No. 13/172,642.
U.S. Notice of Allowance dated Mar. 27, 2014 issued in U.S. Appl. No. 13/172,642.
U.S. Office Action dated Jan. 14, 2016 issued in U.S. Appl. No. 14/309,723.
U.S. Notice of Allowance dated Jun. 9, 2016 issued in U.S. Appl. No. 14/309,723.
U.S. Notice of Allowability dated Sep. 13, 2016 issued in U.S. Appl. No. 14/309,723.
U.S. Office Action dated Nov. 2, 2015 issued in U.S. Appl. No. 13/893,242.
U.S. Office Action dated May 18, 2016 issued in U.S. Appl. No. 13/893,242.
U.S. Notice of Allowance dated Dec. 8, 2016 issued in U.S. Appl. No. 13/893,242.
U.S. Office Action dated Aug. 18, 2015 issued in U.S. Appl. No. 14/308,258.
U.S. Notice of Allowance dated Jan. 12, 2016 issued in U.S. Appl. No. 14/308,258.
U.S. Office Action dated Feb. 1, 2016 issued in U.S. Appl. No. 14/103,395.
U.S. Notice of Allowance dated Jul. 15, 2016 issued in U.S. Appl. No. 14/103,395.
U.S. Notice of Allowance (Corrected Notice of Allowability) dated Aug. 24, 2016 issued in U.S. Appl. No. 14/103,395.
U.S. Notice of Allowance (Corrected Notice of Allowability) dated Nov. 16, 2016 issued in U.S. Appl. No. 14/103,395.
U.S. Office Action dated Apr. 6, 2017 issued in U.S. Appl. No. 15/291,543.
U.S. Notice of Allowance dated Jul. 28, 2017 issued in U.S. Appl. No. 15/291,543.
U.S. Office Action dated Oct. 15, 2014 issued in U.S. Appl. No. 13/904,283.
U.S. Notice of Allowance dated May 5, 2015 issued in U.S. Appl. No. 13/904,283.
U.S. Notice of Allowance dated Feb. 1, 2016 issued in U.S. Appl. No. 13/904,283.
U.S. Notice of Allowance dated Aug. 2, 2016 issued in U.S. Appl. No. 13/904,283.
U.S. Office Action dated May 26, 2017 issued in U.S. Appl. No. 15/231,623.
PCT International Search Report and Written Opinion dated Jan. 12, 2011 issued in Application No. PCT/US2010/037520.
Chinese Office Action dated Jul. 19, 2011 issued in Application No. CN 201130081716.6.
Taiwan Office Action dated Nov. 28, 2011 issued in Application No. TW 100301923.
Korean Office Action dated Apr. 20, 2012 issued in Application No. KR 2011-0012881.
Chinese First Office Action dated Jan. 20, 2015 issued in Application No. CN 201110192296.8.
Chinese Second Office Action dated Sep. 23, 2015 issued in Application No. CN 201110192296.8.
Chinese Third Office Action dated Jan. 15, 2016 issued in Application No. CN 201110192296.8.
Chinese Fourth Office Action dated May 5, 2016 issued in Application No. CN 201110192296.8.
Korean Office Action dated Mar. 14, 2017 issued in Application No. KR 10-2011-0066023.
Korean Office Action dated Aug. 11, 2017 issued in Application No. KR 10-2017-0060181.
Taiwan Office Action dated Apr. 8, 2015 issued in Application No. TW 100123415.
Taiwan Office Action and Search Report dated Mar. 4, 2016 issued in Application No. TW 104127539.
Taiwan Office Action and Search Report dated Aug. 5, 2016 issued in Application No. TW 102117113.
Austrian Office Action dated Aug. 14, 2014 issued in A50817/2013.
Austrian Search Report dated Dec. 5, 2014 issued in A50817/2013.
Chinese First Office Action dated Nov. 26, 2015 issued in CN 201310683415.9.
Chinese Second Office Action dated Aug. 3, 2016 issued in CN 201310683415.9.
Taiwan Examination and Search Report dated Apr. 14, 2017 issued in TW 102145866.
Akire et al., (Nov. 1982) "High-Speed Selective Electroplating with Single Circular Jets," *J. Electrochem. Soc.: Electrochemical Science and Technology*, 129(11):2424-2432.
*Electrochemical Methods: Fundamentals and Applications*, Bard & Faulkner eds. Chapter 8, Dec. 2000, pp. 280-292.
Fang et al. (2004) "Uniform Copper Electroplating on Resistive Substrates," Abs. 167, 205th Meeting, The Electrochemical Society, Inc., 1 page.
Lowenheim, (1978) "Electroplating," *Sponsored by the American Electroplaters' Society*, McGraw-Hill Book Company, New York, p. 139.
Malmstadt et al., (1994) "Microcomputers and Electronic Instrumentation: Making the Right Connections," American Chemical Society, p. 255.
"Release of Sabre™ electrofill tool with HRVA by Novellus Systems, Inc." dated prior to Jun. 2011 (3 pages).
Schwartz, Daniel T. et al., (1987) "Mass-Transfer Studies in a Plating Cell with a Reciprocating Paddle," *Journal of the Electrochemical Society*, 134(7):1639-1645.
Wilson, Gregory J. et al., (2005) "Unsteady Numerical Simulation of the Mass Transfer within a Reciprocating Paddle Electroplating Cell," *Journal of the Electrochemical Society*, 152(6):C356-C365.
U.S. Appl. No. 15/225,716, filed Aug. 1, 2016, Thorkelsson et al.
U.S. Appl. No. 15/413,252, filed Jan. 23, 2017, Thorkelsson et al.
U.S. Appl. No. 15/455,011, filed Mar. 9, 2017, Graham et al.
U.S. Appl. No. 16/432,398, filed Jun. 5, 2019, Thorkelsson et al.
U.S. Office Action dated Apr. 13, 2018 issued in U.S. Appl. No. 15/261,244.
U.S. Final Office Action dated Oct. 16, 2018 issued in U.S. Appl. No. 15/261,244.
U.S. Office Action dated Feb. 15, 2018 issued in U.S. Appl. No. 15/448,472.
U.S. Notice of Allowance dated Sep. 14, 2018 issued in U.S. Appl. No. 15/448,472.
U.S. Notice of Allowance dated Sep. 20, 2017 issued in U.S. Appl. No. 15/231,623.
U.S. Office Action dated Feb. 9, 2018 issued in U.S. Appl. No. 14/924,124.
U.S. Notice of Allowance dated Jun. 12, 2018 issued in U.S. Appl. No. 14/924,124.
U.S. Office Action dated Dec. 31, 2018 issued in U.S. Appl. No. 15/455,011.
U.S. Office Action dated Oct. 30, 2018 issued in U.S. Appl. No. 15/413,252.
U.S. Notice of Allowance dated Oct. 30, 2018 issued in U.S. Appl. No. 15/161,081.
Chinese First Office Action dated Feb. 5, 2018 issued in Application No. CN 201610916461.2.
Korean First Office Action dated Mar. 5, 2018 issued in Application No. KR 10-2017-0168351.
Korean Decision for Grant of Patent dated Sep. 21, 2018 issued in Application No. KR 10-2017-0168351.
Chinese First Office Action dated May 24, 2018 issued in Application No. CN 201610966878.X.

(56) References Cited

OTHER PUBLICATIONS

Taiwan First Office Action dated Mar. 21, 2018 issued in Application No. TW 106132551.
Japanese First Office Action dated Dec. 21, 2017 issued in Application No. JP 2013-257021.
Japanese Second Office Action dated Oct. 2, 2018 issued in Application No. JP 2013-257021.
Taiwan Notice of Allowance and Search Report dated Oct. 31, 2017 issued in Application No. TW 103118470.
Taiwan First Office Action dated May 31, 2018 issued in Application No. TW 106141265.
Chinese First Office Action dated Mar. 2, 2018 issued in Application No. CN 201610756695.5.
Chinese Second Office Action dated Dec. 28, 2018 issued in Application No. CN 201610756695.5.
International Search Report and Written Opinion dated Jun. 15, 2018 issued in Application No. PCT/US2018/021387.
Chinese First Office Action dated Oct. 8, 2018 issued in Application No. CN 201710374684.5.
International Search Report and Written Opinion dated Jan. 10, 2019 issued in Application No. PCT/US2018/051447.
U.S. Appl. No. 15/707,805, filed Sep. 18, 2017, Banik et al.
U.S. Appl. No. 15/846,029, filed Dec. 18, 2017, Buckalew et al.
U.S. Appl. No. 16/101,291, filed Aug. 10, 2018, Banik et al.
U.S. Office Action dated Jul. 10, 2019 issued in U.S. Appl. No. 15/799,903.
U.S. Notice of Allowance dated Jan. 31, 2020 issued in U.S. Appl. No. 15/799,903.
U.S. Office Action dated Oct. 25, 2018 issued in U.S. Appl. No. 15/225,716.
U.S. Notice of Allowance dated Mar. 8, 2019 issued in U.S. Appl. No. 15/225,716.
Korean First Office Action dated Jan. 8, 2020 issued in Application No. KR 10-2013-0054677.
Chinese Second Office Action dated Feb. 19, 2019 issued in Application No. CN 201610966878.X.
International Preliminary Report on Patentability dated Sep. 19, 2019 issued in Application No. PCT/US2018/021387.
Chinese Second Office Action dated Jul. 2, 2019 issued in Application No. CN 201710374684.5.
International Search Report and Written Opinion dated Jan. 29, 2019 issued in Application No. PCT/US18/00362.
Taiwanese First Office Action dated Feb. 20, 2020 issued in Application No. TW 105126685.
International Preliminary Report on Patentability dated Mar. 5, 2020 issued in PCT Application No. PCT/US2018/000362.
KR Office Action dated May 19, 2020 issued in KRr Application No. 20130155069.

* cited by examiner

METHODS AND APPARATUS FOR CONTROLLING DELIVERY OF CROSS FLOWING AND IMPINGING ELECTROLYTE DURING ELECTROPLATING

BACKGROUND

The disclosed embodiments relate to methods and apparatus for controlling electrolyte hydrodynamics during electroplating. More particularly, methods and apparatus described herein are particularly useful for plating metals onto semiconductor wafer substrates, such as through resist plating of small microbumping features (e.g., copper, nickel, tin and tin alloy solders) having widths less than, e.g., about 50 µm, and copper through silicon via (TSV) features.

Electrochemical deposition is now poised to fill a commercial need for sophisticated packaging and multichip interconnection technologies known generally and colloquially as wafer level packaging (WLP) and through silicon via (TSV) electrical connection technology. These technologies present their own very significant challenges due in part to the generally larger feature sizes (compared to Front End of Line (FEOL) interconnects) and high aspect ratios.

Depending on the type and application of the packaging features (e.g., through chip connecting TSV, interconnection redistribution wiring, or chip to board or chip bonding, such as flip-chip pillars), plated features are usually, in current technology, greater than about 2 micrometers and are typically about 5-100 micrometers in their principal dimension (for example, copper pillars may be about 50 micrometers). For some on-chip structures such as power busses, the feature to be plated may be larger than 100 micrometers. The aspect ratios of the WLP features are typically about 1:1 (height to width) or lower, though they can range as high as perhaps about 2:1 or so, while TSV structures can have very high aspect ratios (e.g., in the neighborhood of about 20:1).

SUMMARY

Certain embodiments herein relate to methods and apparatus for electroplating material onto a substrate. Typically, the substrate is a semiconductor wafer.

In one aspect of the embodiments herein, an electroplating apparatus is provided, the apparatus including: (a) a plating chamber configured to contain an electrolyte and an anode while electroplating metal onto a substrate, the substrate being substantially planar; (b) a substrate holder configured to support the substrate such that a plating face of the substrate is immersed in the electrolyte and separated from the anode during plating; (c) an ionically resistive element adapted to provide ionic transport through the ionically resistive element during electroplating, where the ionically resistive element includes a plate that is at least about coextensive with the substrate and a plurality of through-holes formed in the plate; (d) an ionically resistive element manifold positioned below the ionically resistive element, where during electroplating electrolyte passes from the ionically resistive element manifold, through the through-holes in the ionically resistive element; (e) a cross flow manifold positioned above the ionically resistive element and below the plating face of the substrate, when the substrate is present in the substrate holder; (f) a side inlet for introducing electrolyte to the cross flow manifold; (g) a side outlet for receiving electrolyte flowing in the cross flow manifold, where the side inlet and side outlet are positioned proximate azimuthally opposing perimeter locations on the plating face of the substrate during electroplating, and where the side inlet and side outlet are adapted to generate cross-flowing electrolyte in the cross flow manifold during electroplating; and (h) a three way valve that controls delivery of electrolyte to each of (i) the side inlet and (ii) the ionically resistive element manifold.

In some embodiments, the apparatus further includes a controller configured to switch the three way valve during electroplating to provide at least a first flow pattern and a second flow pattern while electroplating on the substrate. The second flow pattern may provide a relatively greater degree of impinging electrolyte at the plating face of the substrate, as compared to the first flow pattern. In a number of cases, the three valve way permits independent control over delivery of electrolyte to the side inlet and to the ionically resistive element manifold.

In certain implementations, the apparatus further includes a controller configured to switch the three way valve during electroplating to provide at least a first plating regime and a second plating regime while electroplating on the substrate, where during the first plating regime, a first flow pattern is provided, where during the second plating regime, a second flow pattern and a third flow pattern are cyclically provided, and where the second flow pattern provides a relatively greater degree of impinging electrolyte on the plating face of the substrate, as compared to the first flow pattern. In some such cases, the controller is configured to operate the three way valve such that (i) the first flow pattern delivers electrolyte to both the side inlet and to the ionically resistive element manifold, and (ii) the second flow pattern delivers electrolyte to the ionically resistive element manifold, but not to the side inlet. In some cases, the controller is configured to operate the three way valve such that the first flow pattern and second flow pattern each deliver electrolyte to both the side inlet and to the ionically resistive element manifold, where a flow of electrolyte to the side inlet is relatively greater in the first flow pattern compared to the second flow pattern, and where a flow of electrolyte to the ionically resistive element manifold is relatively greater in the second flow pattern compared to the first flow pattern.

In some embodiments, the three way valve controls delivery of electrolyte to the side inlet and to the ionically resistive element manifold in a non-independent manner such that when a flow of electrolyte to the side inlet increases, a flow of electrolyte to the ionically resistive element manifold decreases, and vice versa.

In various implementations, the ionically resistive element includes a plurality of ribs on an upper surface of the ionically resistive element, the ribs being linear and extending across the cross flow manifold. In some such implementations, the apparatus further includes a plurality of electrolyte jets formed in the ribs on the ionically resistive element. The electrolyte delivered to the plurality of electrolyte jets may be electrically isolated from the anode in some cases. In some embodiments, the apparatus further includes a membrane frame for supporting a membrane that separates the anode from the substrate during electroplating, where the membrane frame defines a bottom surface of the ionically resistive element manifold, the apparatus further including an electrolyte conduit formed in the membrane frame and in the ionically resistive element, where the electrolyte conduit provides electrolyte to the plurality of electrolyte jets. A second three way valve may be provided in some cases. The second three way valve may control delivery of electrolyte to the ionically resistive element manifold and to the electrolyte conduit formed in the membrane frame and in the ionically resistive element.

In a further aspect of the embodiments herein, an electroplating apparatus is provided, the apparatus including: (a) a plating chamber configured to contain an electrolyte and an anode while electroplating metal onto a substrate, the substrate being substantially planar; (b) a substrate holder configured to support the substrate such that a plating face of the substrate is immersed in the electrolyte and separated from the anode during plating; (c) an ionically resistive element adapted to provide ionic transport through the ionically resistive element during electroplating, where the ionically resistive element includes: a plate that is at least about coextensive with the substrate, a plurality of through-holes formed in the plate, and a plurality of ribs on a top surface of the plate, where at least some of the ribs include electrolyte jets that deliver electrolyte toward the plating face of the substrate during electroplating, where the electrolyte delivered through the electrolyte jets is electrically isolated from the anode; (d) an ionically resistive element manifold positioned below the ionically resistive element, where during electroplating electrolyte passes from the ionically resistive element manifold, through the through-holes in the ionically resistive element; (e) a cross flow manifold positioned above the ionically resistive element and below the plating face of the substrate, when the substrate is present in the substrate holder; (f) a side inlet for introducing electrolyte to the cross flow manifold; and (g) a side outlet for receiving electrolyte flowing in the cross flow manifold, where the side inlet and side outlet are positioned proximate azimuthally opposing perimeter locations on the plating face of the substrate during electroplating, and where the side inlet and side outlet are adapted to generate cross-flowing electrolyte in the cross flow manifold during electroplating.

In some implementations, the ribs are linear and are oriented such that their longest dimension is parallel to a direction between the side inlet and side outlet. In some other implementations, the ribs are linear and are oriented such that their longest dimension is perpendicular to a direction between the side inlet and side outlet. The apparatus may further include a first three way valve that controls delivery of electrolyte to both (i) the electrolyte jets, and (ii) the ionically resistive element manifold. The apparatus may also include a second three way valve that controls delivery of electrolyte to both (i) the side inlet, and (ii) the first three way valve.

In a further aspect of the embodiments herein, a method of electroplating is provided. The method involves providing a substrate to any of the apparatus described herein, and electroplating material onto the substrate. Any variety of flow patterns and flow regimes may be used, as described herein.

These and other features will be described below with reference to the associated drawings.

DETAILED DESCRIPTION

In this application, the terms "semiconductor wafer," "wafer," "substrate," "wafer substrate," and "partially fabricated integrated circuit" are used interchangeably. One of ordinary skill in the art would understand that the term "partially fabricated integrated circuit" can refer to a silicon wafer during any of many stages of integrated circuit fabrication thereon. A wafer or substrate used in the semiconductor device industry typically has a diameter of 200 mm, or 300 mm, or 450 mm. Further, the terms "electrolyte," "plating bath," "bath," and "plating solution" are used interchangeably. The following detailed description assumes the embodiments are implemented on a wafer. However, the embodiments are not so limited. The work piece may be of various shapes, sizes, and materials. In addition to semiconductor wafers, other work pieces that may take advantage of the disclosed embodiments include various articles such as printed circuit boards, magnetic recording media, magnetic recording sensors, mirrors, optical elements, micro-mechanical devices and the like.

In the following description, numerous specific details are set forth in order to provide a thorough understanding of the presented embodiments. The disclosed embodiments may be practiced without some or all of these specific details. In other instances, well-known process operations have not been described in detail to not unnecessarily obscure the disclosed embodiments. While the disclosed embodiments will be described in conjunction with the specific embodiments, it will be understood that it is not intended to limit the disclosed embodiments.

Described herein are apparatus and methods for electroplating one or more metals onto a substrate. Embodiments are described generally where the substrate is a semiconductor wafer; however the embodiments are not so limited.

Figure 1A:
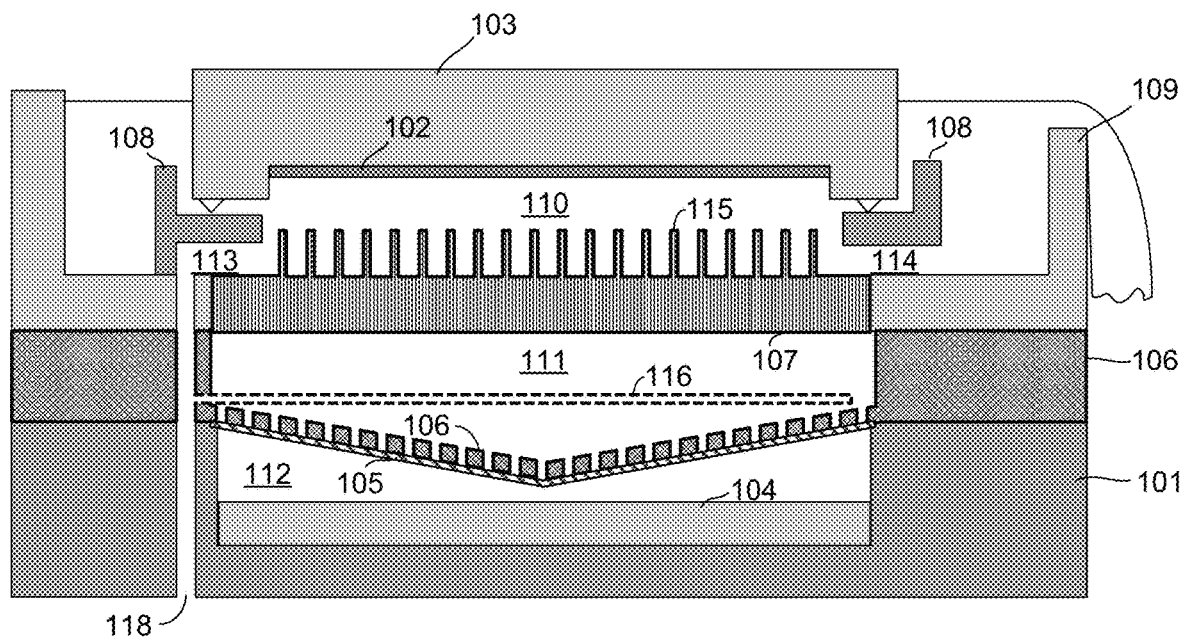
FIG. 1A illustrates an electroplating apparatus that utilizes a combination of cross flow and impinging flow on the substrate surface during electroplating.
Figure 1B:
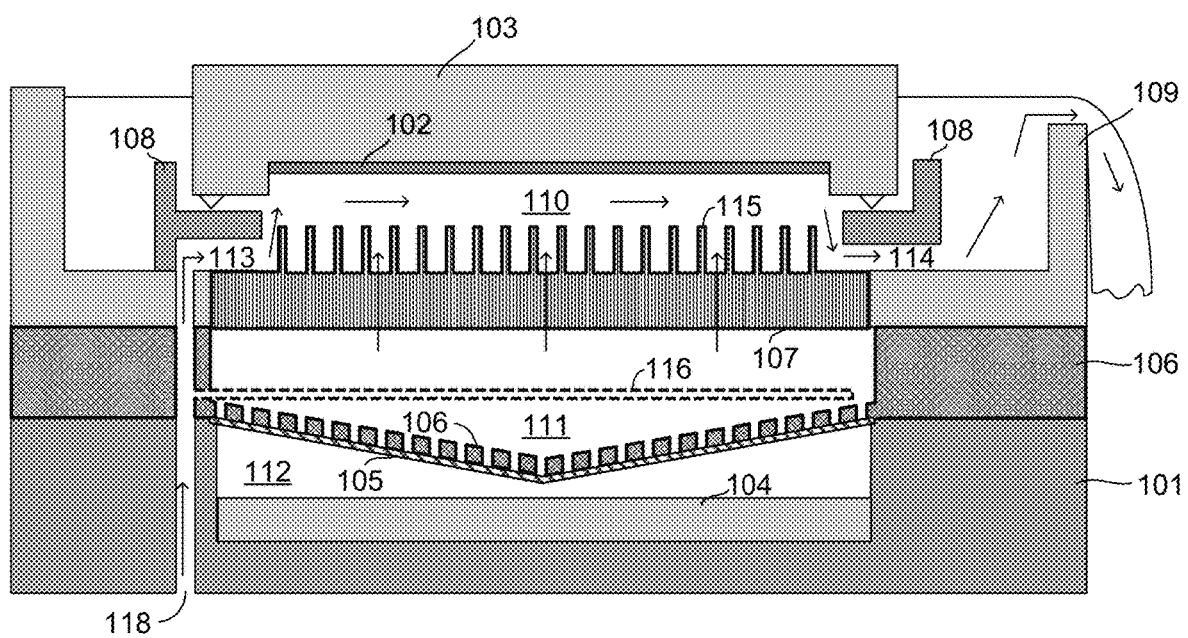
FIG. 1B shows the flow of electrolyte through the electroplating apparatus shown in FIG. 1A.

FIGS. 1A and 1B depict simplified cross-sectional views of an electroplating apparatus. FIG. 1B includes arrows showing the flow of electrolyte during electroplating in various embodiments. FIG. 1A depicts an electroplating cell 101, with substrate 102 positioned in a substrate holder 103. Substrate holder 103 is often referred to as a cup, and it may support the substrate 102 at its periphery. An anode 104 is positioned near the bottom of the electroplating cell 101. The anode 104 is separated from the substrate 102 by a membrane 105, which is supported by a membrane frame 106. Membrane frame 106 is sometimes referred to as an anode chamber membrane frame, as it defines the top of the anode chamber housing the anode. Further, the anode 104 is separated from the substrate 102 by an ionically resistive element 107. The ionically resistive element 107 includes openings that allow electrolyte to travel through the ionically resistive element 107 to impinge upon the substrate 102. A front side insert 108 is positioned above the ionically resistive element 107, proximate the periphery of the substrate 102. The front side insert 108 may be ring-shaped, and may be azimuthally non-uniform, as shown. The front side insert 108 is sometimes also referred to as a cross flow confinement ring.

An anode chamber 112 is below the membrane 105, and is where the anode 104 is located. An ionically resistive element manifold 111 is above the membrane 105 and below the ionically resistive element 107. An irrigation flute 116 delivers catholyte to the ionically resistive element manifold 111, and may act to irrigate the membrane 105 during electroplating. In this example, the irrigation flute 116 is fed by electrolyte that passes through catholyte inlet 118. A cross flow manifold 110 is above the ionically resistive element 107 and below the substrate 102. The height of the cross flow manifold is considered to be the distance between the substrate 102 and the plane of the ionically resistive element 107 (excluding the ribs 115 on the upper surface of the ionically resistive element 107, if present). In some cases, the cross flow manifold may have a height between about 1 mm-4 mm, or between about 0.5 mm-15 mm. The cross flow manifold 110 is defined on its sides by the front side insert 108, which acts to contain the cross flowing electrolyte within the cross flow manifold 110. A side inlet 113 to the cross flow manifold 110 is provided azimuthally opposite a side outlet 114 to the cross flow manifold 110. The side inlet 113 and side outlet 114 may be formed, at least partially, by the front side insert 108. As shown by the arrows in FIG. 1B, electrolyte travels from the catholyte inlet 118, through the side inlet 113, into the cross flow manifold 110, and out the side outlet 114. In addition, electrolyte may travel through one or more inlets to the ionically resistive element manifold 111 (e.g., inlets in irrigation flute 116 and/or other inlets), into the ionically resistive element manifold 111, through the openings in the ionically resistive element 107, into the cross flow manifold 110, and out the side outlet 114. After passing through the side outlet 114, the electrolyte spills over weir wall 109. The electrolyte may be recovered and recycled.

In certain embodiments, the ionically resistive element 107 approximates a nearly constant and uniform current source in the proximity of the substrate (cathode) and, as such, may be referred to as a high resistance virtual anode (HRVA) or channeled ionically resistive element (CIRP) in some contexts. Normally, the ionically resistive element 107 is placed in close proximity with respect to the wafer. In contrast, an anode in the same close-proximity to the substrate would be significantly less apt to supply a nearly constant current to the wafer, but would merely support a constant potential plane at the anode metal surface, thereby allowing the current to be greatest where the net resistance from the anode plane to the terminus (e.g., to peripheral contact points on the wafer) is smaller. So while the ionically resistive element 107 has been referred to as a high-resistance virtual anode (HRVA), this does not imply that electrochemically the two are interchangeable. Under certain operational conditions, the ionically resistive element 107 would more closely approximate and perhaps be better described as a virtual uniform current source, with nearly constant current being sourced from across the upper plane of the ionically resistive element 107.

The ionically resistive element 107 contains micro size (typically less than 0.04") through-holes that are spatially and ionically isolated from each other and do not form interconnecting channels within the body of ionically resistive element, in many but not all implementations. Such through-holes are often referred to as non-communicating through-holes. They typically extend in one dimension, often, but not necessarily, normal to the plated surface of the wafer (in some embodiments the non-communicating holes are at an angle with respect to the wafer which is generally parallel to the ionically resistive element front surface). Often the through-holes are parallel to one another. Often the holes are arranged in a square array. Other times the layout is in an offset spiral pattern. These through-holes are distinct from 3-D porous networks, where the channels extend in three dimensions and form interconnecting pore structures, because the through-holes restructure both ionic current flow and (in certain cases) fluid flow parallel to the surface therein, and straighten the path of both current and fluid flow towards the wafer surface. However, in certain embodiments, such a porous plate, having an interconnected network of pores, may be used as the ionically resistive element. When the distance from the plate's top surface to the wafer is small (e.g., a gap of about $\frac{1}{10}$ the size of the wafer radius, for example less than about 5 mm), divergence of both current flow and fluid flow is locally restricted, imparted and aligned with the ionically resistive element channels.

One example ionically resistive element 107 is a disc made of a solid, non-porous dielectric material that is ionically and electrically resistive. The material is also chemically stable in the plating solution of use. In certain cases the ionically resistive element 107 is made of a ceramic material (e.g., aluminum oxide, stannic oxide, titanium oxide, or mixtures of metal oxides) or a plastic material (e.g., polyethylene, polypropylene, polyvinylidene difluoride (PVDF), polytetrafluoroethylene, polysulphone, polyvinyl chloride (PVC), polycarbonate, and the like), having between about 6,000-12,000 non-communicating through-holes. The ionically resistive element 107, in many embodiments, is substantially coextensive with the wafer (e.g., the ionically resistive element 107 has a diameter of about 300 mm when used with a 300 mm wafer) and resides in close proximity to the wafer, e.g., just below the wafer in a wafer-facing-down electroplating apparatus. Preferably, the plated surface of the wafer resides within about 10 mm, more preferably within about 5 mm of the closest ionically resistive element surface. To this end, the top surface of the ionically resistive element 107 may be flat or substantially flat. Often, both the top and bottom surfaces of the ionically resistive element 107 are flat or substantially flat. In a number of embodiments, however, the top surface of the ionically resistive element 107 includes a series of linear ribs, as described further below.

As above, the overall ionic and flow resistance of the plate 107 is dependent on the thickness of the plate and both the overall porosity (fraction of area available for flow through the plate) and the size/diameter of the holes. Plates of lower porosities will have higher impinging flow velocities and ionic resistances. Comparing plates of the same porosity, one having smaller diameter 1-D holes (and therefore a larger number of 1-D holes) will have a more micro-uniform distribution of current on the wafer because there are more individual current sources, which act more as point sources that can spread over the same gap, and will also have a higher total pressure drop (high viscous flow resistance).

In some cases, about 1-10% of the ionically resistive element 107 is open area through which ionic current can pass (and through which electrolyte can pass if there is no other element blocking the openings). In particular embodiments, about 2-5% the ionically resistive element 107 is open area. In a specific example, the open area of the ionically resistive element 107 is about 3.2% and the effective total open cross sectional area is about 23 $cm^2$. In some embodiments, non-communicating holes formed in the ionically resistive element 107 have a diameter of about 0.01 to 0.08 inches. In some cases, the holes have a diameter of about 0.02 to 0.03 inches, or between about 0.03-0.06 inches. In various embodiments the holes have a diameter that is at most about 0.2 times the gap distance between the ionically resistive element 107 and the wafer. The holes are generally circular in cross section, but need not be. Further, to ease construction, all holes in the ionically resistive element 107 may have the same diameter. However this need not be the case, and both the individual size and local density of holes may vary over the ionically resistive element surface as specific requirements may dictate.

The ionically resistive element 107 shown in FIGS. 1A and 1B includes a series of linear ribs 115 that extend into/out of the page. The ribs 115 are sometimes referred to as protuberances. The ribs 115 are positioned on the top surface of the ionically resistive element 107, and in many cases they are oriented such that their length (e.g., their longest dimension) is perpendicular to the direction of cross flowing electrolyte. In a particular embodiment discussed further below, the ribs 115 may be oriented such that their length is parallel to the direction of cross flowing electrolyte. The ribs 115 affect the fluid flow and current distribution within the cross flow manifold 110. For instance, the cross flow of electrolyte is largely confined to the area above the top surface of the ribs 115, creating a high rate of electrolyte cross flow in this area. In the regions between adjacent ribs 115, current delivered upward through the ionically resistive element 107 is redistributed, becoming more uniform, before it is delivered to the substrate surface.

In FIGS. 1A and 1B, the direction of cross flowing electrolyte is left-to-right (e.g., from the side inlet 113 to the side outlet 114), and the ribs 115 are oriented such that their lengths extend into/out of the page. In certain embodiments, the ribs 115 may have a width (measured left-to-right in FIG. 1A) between about 0.5 mm-1.5 mm, or between about 0.25 mm-10 mm. The ribs 115 may have a height (measured up-down in FIG. 1A) between about 1.5 mm-3.0 mm, or between about 0.25 mm-7.0 mm. The ribs 115 may have a height to width aspect ratio (height/width) between about 5/1-2/1, or between about 7/1-1/7. The ribs 115 may have a pitch between about 10 mm-30 mm, or between about 5 mm-150 mm. The ribs 115 may have variable lengths (measured into/out of the page in FIG. 1A) that extend across the face of the ionically resistive element 107. The distance between the upper surface of the ribs 115 and the surface of the substrate 102 may be between about 1 mm-4 mm, or between about 0.5 mm-15 mm. The ribs 115 may be provided over an area that is about coextensive with the substrate, as shown in FIGS. 1A and 1B. The channels/openings in the ionically resistive element 107 may be positioned between adjacent ribs 115, or they may extend through the ribs 115 (in other words, the ribs 115 may or may not be channeled). In some other embodiments, the ionically resistive element 107 may have an upper surface that is flat (e.g., does not include the ribs 115). The electroplating apparatus shown in FIGS. 1A and 1B, including the ionically resistive element with ribs thereon, is further discussed in U.S. Pat. No. 9,523,155, titled "ENHANCEMENT OF ELECTROLYTE HYDRODYNAMICS FOR EFFICIENT MASS TRANSFER DURING ELECTROPLATING," which is herein incorporated by reference in its entirety.

The apparatus may include various additional elements as needed for a particular application. In some cases, an edge flow element may be provided proximate the periphery of the substrate, within the cross flow manifold. The edge flow element may be shaped and positioned to promote a high degree of electrolyte flow (e.g., cross flow) near the edges of the substrate. The edge flow element may be ring-shaped or arc-shaped in certain embodiments, and may be azimuthally uniform or non-uniform. Edge flow elements are further discussed in U.S. patent application Ser. No. 14/924,124, filed Oct. 27, 2015, and titled "EDGE FLOW ELEMENT FOR ELECTROPLATING APPARATUS," which is herein incorporated by reference in its entirety.

In some cases, the apparatus may include a sealing member for temporarily sealing the cross flow manifold. The sealing member may be ring-shaped or arc-shaped, and may be positioned proximate the edges of the cross flow manifold. A ring-shaped sealing member may seal the entire cross flow manifold, while an arc-shaped sealing member may seal a portion of the cross flow manifold (in some cases leaving the side outlet open). During electroplating, the sealing member may be repeatedly engaged and disengaged to seal and unseal the cross flow manifold. The sealing member may be engaged and disengaged by moving the substrate holder, ionically resistive element, front side insert, or other portion of the apparatus that engages with the sealing member. Sealing members and methods of modulating cross flow are further discussed in the following U.S. Patent Applications, each of which is herein incorporated by reference in its entirety: U.S. patent application Ser. No. 15/225,716, filed Aug. 1, 2016, and titled "DYNAMIC MODULATION OF CROSS FLOW MANIFOLD DURING ELECTROPLATING"; and U.S. patent application Ser. No. 15/161,081, filed May 20, 2016, and titled "DYNAMIC MODULATION OF CROSS FLOW MANIFOLD DURING ELECTROPLATING."

In various embodiments, one or more electrolyte jet may be provided to deliver additional electrolyte above the ionically resistive element. The electrolyte jet may deliver electrolyte proximate a periphery of the substrate, or at a location that is closer to the center of the substrate, or both. The electrolyte jet may be oriented in any position, and may deliver cross flowing electrolyte, impinging electrolyte, or a combination thereof. Electrolyte jets are further described in U.S. patent application Ser. No. 15/455,011, filed Mar. 9, 2017, and titled "ELECTROPLATING APPARATUS AND METHODS UTILIZING INDEPENDENT CONTROL OF IMPINGING ELECTROLYTE," which is herein incorporated by reference in its entirety.

One advantage of the apparatus shown in FIGS. 1A and 1B is that it establishes two different types of flow over the substrate surface. Electrolyte that travels up through the ionically resistive element 107 impinges upon the surface of the substrate, and electrolyte that cross-flows through the cross flow manifold 110 shears over the surface of the substrate. These two flows combine to provide high quality plating results. However, it has been found that under certain conditions, the cross flowing electrolyte effectively swamps out the effect of the impinging electrolyte. This may be a result of relatively high cross flow within the cross flow manifold 110, as compared to the flow of electrolyte into the ionically resistive element manifold 111 and through the ionically resistive element 107.

One technique to combat this problem involves delivering electrolyte to different portions of the apparatus at different times, thereby establishing different flows over the substrate at different times over the course of plating the substrate. For instance, the apparatus may periodically or intermittently switch between (a) a first flow pattern that delivers cross flowing electrolyte to the substrate surface, e.g., with electrolyte primarily originating from the side inlet 113, and (b) a second flow pattern that delivers impinging electrolyte to the substrate surface, e.g., with electrolyte primarily originating from the ionically resistive element manifold 111 and traveling through the ionically resistive element 107. Each flow pattern may provide some degree of cross flowing electrolyte, as well as some degree of impinging electrolyte. However, when considering the combined electrolyte flow delivered through the side inlet 113 and through the ionically resistive element 107 from the ionically resistive element manifold 111, the first flow pattern has a higher proportion of the flow being delivered through the side inlet 113, while the second flow pattern has a higher proportion of the flow being delivered from the ionically resistive element manifold 111.

In some cases, the different flow patterns may be used to achieve a desired composition in the electrodeposited material. The degree of electrolyte convection can affect the degree to which certain metals are incorporated into the electrodeposited material. For instance, silver can be incorporated in electrodeposited material (e.g., copper-silver or tin-silver alloys) more easily where there is a relatively high degree of convection. As such, the methods described herein may be used in applications where it is desired to incorporate and maintain a relatively high amount of silver in the deposited material. In these or other cases, the different flow patterns may be used to provide hydrodynamic conditions that are tailored based on the shape of the feature at any given time during electroplating. For instance, one flow pattern or set of flow patterns may be used when the feature has a high aspect ratio, and another flow pattern or set of flow patterns may be used when the feature is more filled, and thus has a lower aspect ratio. In some embodiments, the flow patterns may be chosen to achieve a relatively uniform composition (e.g., degree of silver (or other metal)) in the deposited material over the course of deposition (e.g., such that material deposited deep into the feature has a composition that is uniform with later-deposited material that is shallower in the feature). Examples are described below.

Figure 2A:
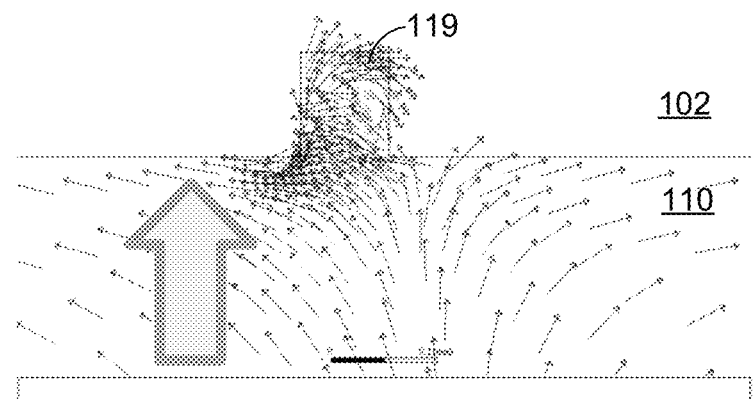
FIGS. 2A-2C illustrate modeling results related to flow of electrolyte within a cross flow manifold, near a plating face of a substrate.
Figure 2B:
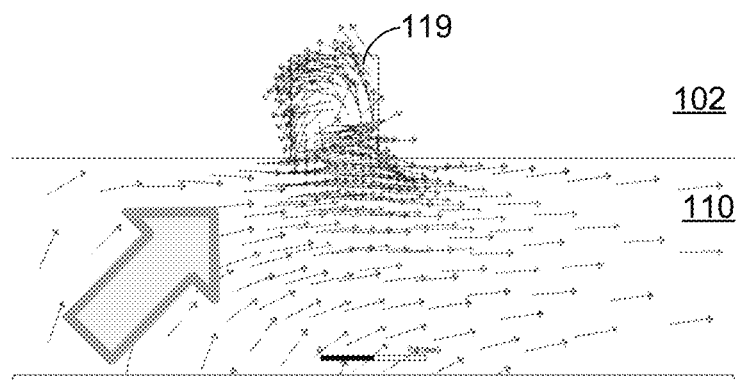
Figure 2C:
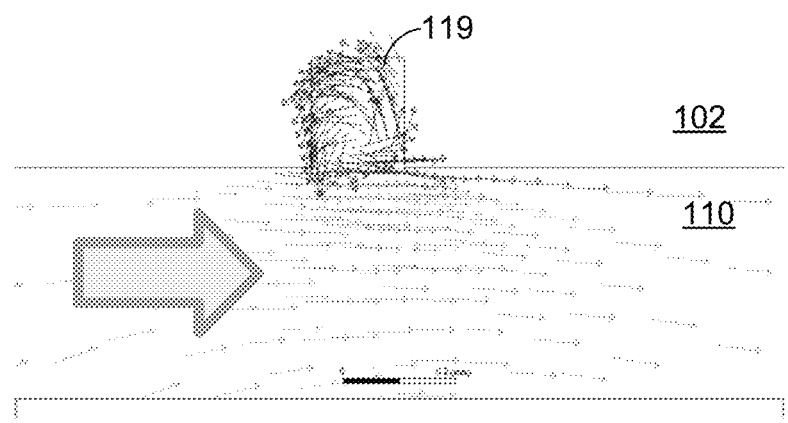

FIGS. 2A-2C illustrate modeling results showing different flow patterns that can be achieved in the cross flow manifold 110 near the surface of the substrate 102. The substrate 102 includes features 119 formed therein. The features 119 are recessed into the surface of the substrate 102. The arrows represent fluid velocity vectors. FIG. 2A depicts the flow pattern achieved when electrolyte is delivered to the cross flow manifold 110 from the ionically resistive element manifold 111, through the ionically resistive element 107, with little or no electrolyte being delivered through the side inlet 113. In this case, there is substantial electrolyte flow impinging on the surface of the substrate. By contrast, FIG. 2C depicts the flow pattern achieved when electrolyte is delivered to the cross flow manifold 110 from the side inlet 113, with little or no electrolyte being delivered through the ionically resistive element manifold 111/ionically resistive element 107. In this case, there is substantial electrolyte cross flow over the surface of the substrate, with essentially no impinging flow. FIG. 2B depicts the flow pattern achieved when electrolyte is delivered to the cross flow manifold 110 through both the side inlet 113 and through the ionically resistive element manifold 111/ionically resistive element 107. In various embodiments, it is advantageous to utilize two or more of the flow patterns in FIGS. 2A-2C over the course of electroplating a single substrate.

Figure 3A:
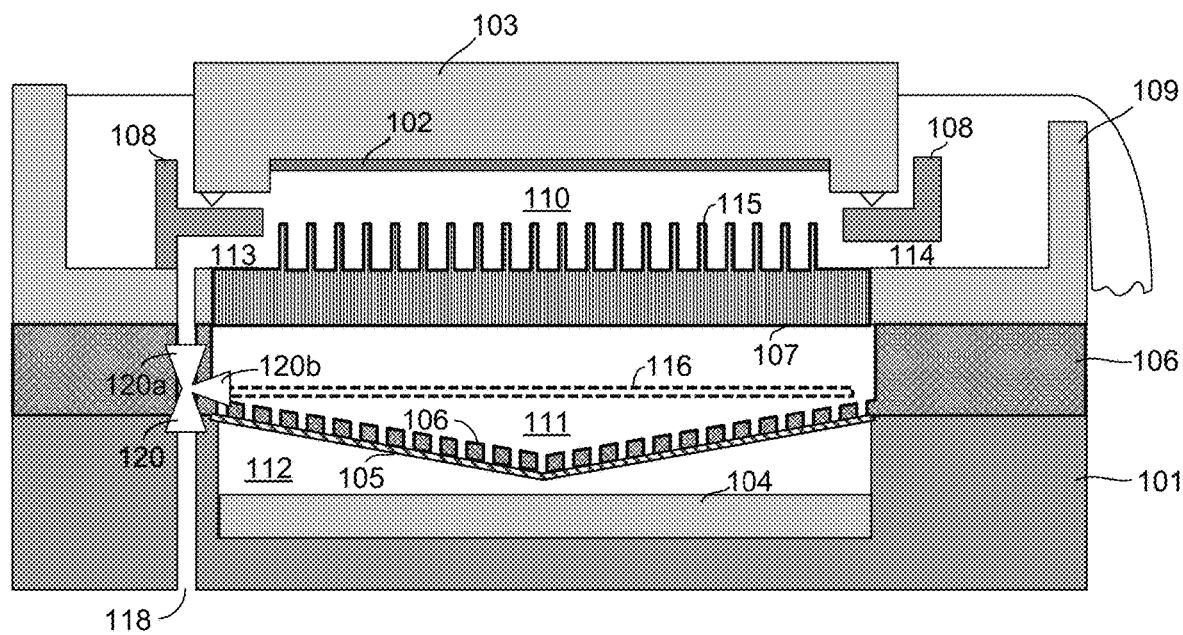
FIG. 3A depicts an electroplating apparatus having a three way valve for delivering electrolyte to a side inlet and to an ionically resistive element manifold.

FIG. 3A illustrates an electroplating apparatus similar to the one shown in FIGS. 1A and 1B, and for the sake of brevity only the differences will be discussed. In FIG. 3A, the apparatus includes a three way valve 120 that affects how electrolyte is delivered within the apparatus. The three way valve 120 includes at least valves 120a and 120b. When valve 120a is open, electrolyte passes from catholyte inlet 118, through valve 120a, through the side inlet 113, through the cross flow manifold 110 (where the electrolyte flows over the surface of the substrate in a shearing manner), out the side outlet 114, and over weir wall 109. When valve 120b is open, electrolyte passes from catholyte inlet 118, through valve 120b, through the irrigation flute 116, into the ionically resistive element manifold 111, through the ionically resistive element 107, into the cross flow manifold 110 (where the electrolyte impinges upon the surface of the substrate), out the side outlet 114, and over weir wall 109. Valves 120a and 120b may be controlled independently or in tandem.

Figure 3B:
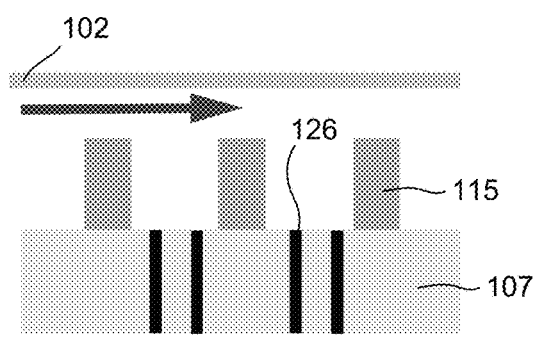
FIG. 3B is a simplified view of cross flowing electrolyte within a cross flow manifold.
Figure 3C:
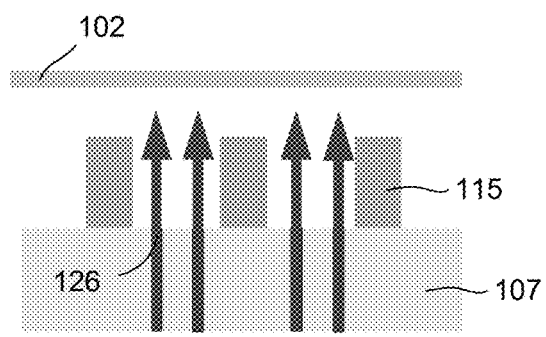
FIG. 3C is a simplified view of impinging electrolyte that passes through an ionically resistive element.

FIG. 3B shows the general flow pattern achieved within the cross flow manifold 110 when valve 120a is open and valve 120b is closed. When this is the case, the electrolyte flow at the substrate surface is primarily cross flowing electrolyte. There is relatively little impinging flow on the substrate surface, because little or no electrolyte is being delivered to the ionically resistive element manifold 111 and through the ionically resistive element 107. By contrast, FIG. 3C shows the flow pattern achieved when valve 120a is closed and valve 120b is open. When this is the case, the electrolyte flow at the substrate surface is primarily impinging electrolyte. There is relatively little cross flow on the substrate surface, because little or no electrolyte is being delivered through the side inlet 113.

In various implementations, the three way valve 120 is operated during electroplating to establish different flow patterns over the course of plating a single substrate. In one example, the three way valve 120 is operated to cyclically change between the flow pattern shown in FIG. 3B and the flow pattern shown in FIG. 3C, during at least a portion of the electroplating process. In this case, valve 120a is open when valve 120b is closed, and vice versa. In another embodiment, valve 120a remains open over the course of electroplating, while valve 120b opens and closes over the course of electroplating. In another embodiment, valve 120b remains open over the course of electroplating, while valve 120a opens and closes over the course of electroplating. In another embodiment, valve 120a and valve 120b each remain open over the course of electroplating, with one or both of the valves partially closing and re-opening over the course of electroplating. Partially closing a valve reduces, but does not stop, the flow of electrolyte through the valve.

Table 1 provides various examples of different types of flow patterns that can be established by controlling valves 120a and 120b. Generally, the degree of cross flow is determined by the position of valve 120a, which controls the flow of electrolyte delivered to the side inlet 113. The degree of impinging flow is determined by (a) the position of the valve 120b, which controls the flow of electrolyte delivered to the irrigation flute 116, and also by (b) the position of the valve 120a. The degree of impinging flow is affected by the position of valve 120a because a high degree of cross flowing electrolyte delivered through the side inlet 113 can act to swamp out the impinging electrolyte delivered through the ionically resistive element 107. Conversely, a high degree of cross flow can be maintained even where there is substantial impinging flow.

TABLE 1

| Flow Pattern | Valve 120a | Valve 120b | Description |
|---|---|---|---|
| 1 | Fully Open | Closed | High cross flow with little or no impinging flow |
| 2 | Partly Open | Closed | Moderate cross flow with little or no impinging flow |
| 3 | Fully Open | Partly Open | High cross flow with low impinging flow |
| 4 | Partly Open | Partly Open | Moderate cross flow with low impinging flow |
| 5 | Closed | Partly Open | Little or no cross flow with moderate impinging flow |
| 6 | Fully Open | Fully Open | High cross flow with moderate impinging flow |
| 7 | Partly Open | Fully Open | Moderate cross flow with moderate impinging flow |
| 8 | Closed | Fully Open | Little or no cross flow with high impinging flow |

The three way valve 120 may be operated during electroplating to periodically or intermittently switch between any two or more of the flow patterns described herein.

Figure 4A:
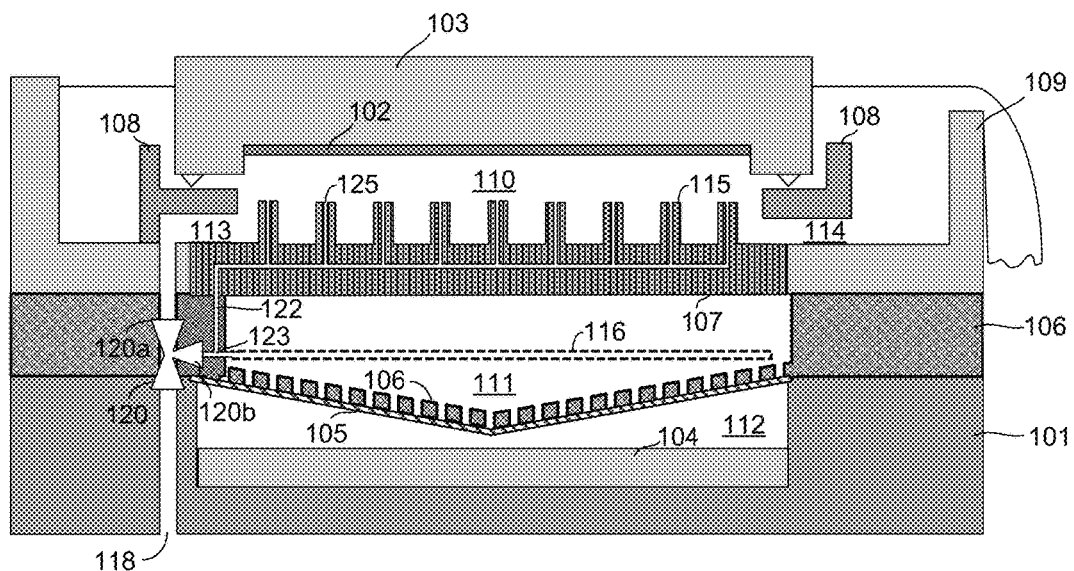
FIG. 4A is a simplified view of an electroplating apparatus similar to the one shown in FIG. 3A, with the addition of an electrolyte conduit and a plurality of electrolyte jets that deliver electrolyte near a surface of a substrate.

FIG. 4A illustrates an electroplating apparatus similar to the one shown in FIG. 3A, and for the sake of brevity only the differences will be discussed. The apparatus of FIG. 4A includes an electrolyte conduit 122 that delivers electrolyte to a plurality of electrolyte jets 125 that are formed in the ribs 115 of the ionically resistive element 107. While the ribs 115 shown in FIG. 4A are wider and farther apart compared to those in FIG. 3A, this is done for the sake of illustrating the electrolyte jets 125. In another embodiment, electrolyte jets 125 may be formed in ribs 115 that are thinner and closer together, similar to those shown in FIG. 3A.

In FIG. 4A, the electrolyte conduit 122 is formed in the membrane frame 106 and in the ionically resistive element 107. The electrolyte conduit 122 is in fluid communication with fluid junction 123. Fluid junction 123 receives electrolyte when valve 120b is open. In some cases, fluid junction 123 includes its own valve (e.g., a three way valve, not shown) similar to valve 120. In other cases, this valve may be omitted, as shown in FIG. 4A. When a valve is included at fluid junction 123, it can be used to independently control delivery of electrolyte to the electrolyte conduit 122 and to the irrigation flute 116.

The electrolyte jets 125 deliver impinging electrolyte to the surface of the substrate. One advantage of the electrolyte jets 125 is that they deliver electrolyte very close to the substrate surface, due to the proximity of the top surface of the ribs 115 to the surface of the substrate 102. In this example, the electrolyte jets 125 deliver electrolyte significantly closer to the surface of the substrate compared to the other openings in the ionically resistive element (e.g., openings on the non-raised/non-ribbed planar portion of the ionically resistive element 107). As a result, it is easier to ensure that impinging electrolyte reaches the surface of the substrate 102, without being overcome/swamped out by cross flowing electrolyte in the cross flow manifold 110.

Another advantage of providing electrolyte jets 125 as shown in FIG. 4A is that the electrolyte jets 125 deliver electrolyte that is electrically isolated from the anode 104. By contrast, electrolyte originating from the ionically resistive element manifold 111, delivered through the ionically resistive element 107, is in electrical communication with the anode 104. By including electrolyte jets 125 that deliver electrolyte that is electrically isolated from the anode, the electrolyte flow and current distribution within the apparatus can each be optimized. Similarly, the inclusion of a valve at an appropriate location (e.g., a location that affects delivery of electrolyte to both the electrolyte conduit 122 and to the ionically resistive element manifold 111, e.g., at fluid junction 123) enables fine control over the degree and timing of electrolyte flow and current distribution at the surface of the substrate over the course of electroplating.

Figure 4B:
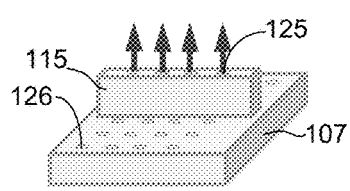
FIGS. 4B-4H illustrate close-up views of an ionically resistive element having electrolyte jets formed therein, with electrolyte being delivered through the electrolyte jets (FIGS. 4B and 4E), through the through-holes in the ionically resistive element (FIGS. 4C, 4F), through both the electrolyte jets and the through-holes (FIGS. 4D, 4G), and through the side inlet (FIG. 4H).
Figure 4C:
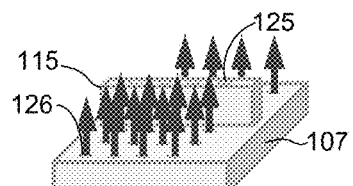
Figure 4D:
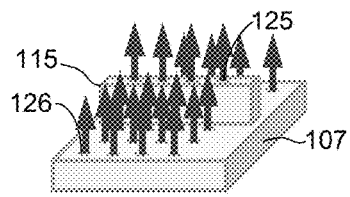

FIGS. 4B-4D illustrate close-up perspective views of ionically resistive elements 107 having linear ribs 115 formed thereon, where the ribs 115 are adapted to form electrolyte jets 125. In each case, the ionically resistive element 107 includes two types of openings: (1) through-holes 126 and (2) electrolyte jets 125. The through-holes 126 allow electrolyte to travel from the ionically resistive element manifold 111, through the ionically resistive element 107, into the cross flow manifold 110. The through-holes 126 may also be referred to as channels or pores. The through-holes 126 provide electrolyte that is in electrical communication with the anode 104, while the electrolyte jets 125 provide electrolyte that is not in electrical communication with the anode 104. In FIG. 4B, the electrolyte is delivered through the electrolyte jets 125, but not through the through-holes 126. This can be accomplished by ensuring that valve 120b is open, while a valve (not shown) at fluid junction 123 allows electrolyte to pass into the electrolyte conduit 122, but not into irrigation flute 116. As a result, the electrolyte delivered into the cross flow manifold 110 is substantially electrically isolated from the anode 104 (although it is understood that some electrolyte in electrical communication with the anode 104 may leak through the ionically resistive element 107 into the cross flow manifold 110, even when electrolyte is not actively delivered to the ionically resistive element manifold 111). In FIG. 4C, the electrolyte is delivered through through-holes 126, but not through electrolyte jets 125. This can be accomplished by ensuring that valve 120b is open, while the valve (not shown) at fluid junction 123 allows electrolyte to pass into the irrigation flute 116, but not into electrolyte conduit 122. In FIG. 4D, electrolyte is delivered into the cross flow manifold 110 through both the electrolyte jets 125 and the through-holes 126. This can be accomplished by ensuring that valve 120b is open, and either (a) no valve is provided at fluid junction 123, or (b) a valve (not shown) at fluid junction 123 is open to allow electrolyte to pass into both electrolyte conduit 122 and irrigation flute 116.

Figure 4E:
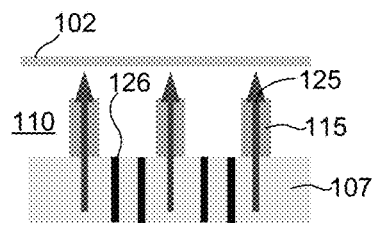
Figure 4F:
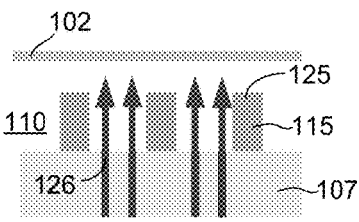
Figure 4G:
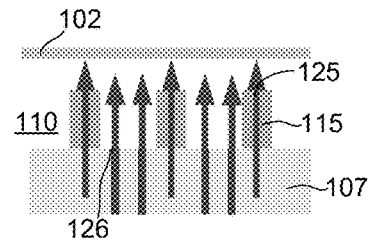
Figure 4H:
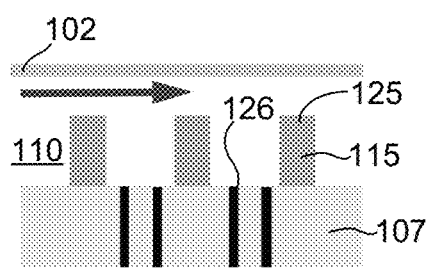

FIGS. 4E-4G illustrate cross-sectional views of ionically resistive elements 107 as shown in FIGS. 4A-4D. FIG. 4E depicts the flow of electrolyte through the electrolyte jets 125, similar to FIG. 4B. FIG. 4F shows the flow of electrolyte through the through-holes 126, similar to FIG. 4C. FIG. 4G shows the flow of electrolyte through both the electrolyte jets 125 and the through-holes 126, similar to FIG. 4D. FIG. 4H illustrates the flow of electrolyte through the cross flow manifold 110 where the electrolyte flow originates as cross flow from the side inlet 113. It is understood that these flows may be combined as desired for a particular application.

Figure 4I:
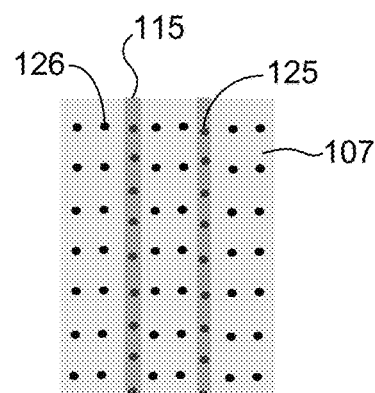
FIG. 4I shows a close-up top-down view of an ionically resistive element having electrolyte jets formed therein, where the electrolyte jets are formed in ribs on the ionically resistive element.

FIG. 4I illustrates a close-up top-down view of a portion of an ionically resistive element 107 as shown in FIGS. 4A-4H. The electrolyte jets 125 are provided on ribs 115, and through-holes 126 are provided on the non-ribbed planar portion of the ionically resistive element 107.

Figure 4J:
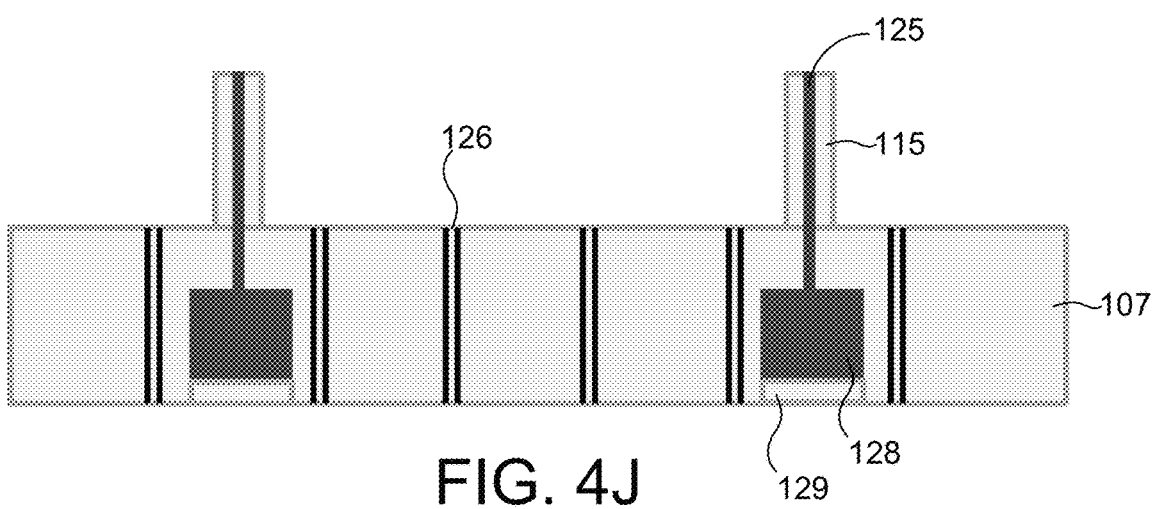
FIG. 4J shows a cross-sectional view of a portion of an ionically resistive element having electrolyte jets formed therein.

FIG. 4J depicts a close-up cross-sectional view of an ionically resistive element 107 as described in relation to FIGS. 4A-4I. In this figure, chamber 128 is visible. Chamber 128 stretches along the length of the ionically resistive element 107, parallel with the ribs 115. In FIG. 4J, chamber 128 extends into/out of the page. The chamber 128 may be fed by (or integral with) electrolyte conduit 122 or another source of electrolyte which is electrically isolated from the anode 104. The chamber 128 delivers electrolyte to the electrolyte jets 125. In one example, the chamber 128 may be formed by drilling, in which case floor 129 may be attached after drilling. In another example, the ionically resistive element 107 may be formed through 3D printing techniques, in which case there is no need to drill chamber 128.

Figure 4K:
FIGS. 4K-4M show top-down views of differently shaped electrolyte jets that may be used according to certain embodiments.
Figure 4L:
Figure 4M:

FIGS. 4K-4M depict top-down views of ribs 115 having differently shaped electrolyte jets 125 formed therein, as described in relation to FIGS. 4A-4J. In FIG. 4K, the electrolyte jets 125 are circular openings. In FIG. 4L, the electrolyte jets 125 are ovular openings, with the longest dimension of the oval being parallel with the length/longest dimension of the rib 115. In FIG. 4M, the electrolyte jets 125 are rectangular openings, with the longest dimension of the rectangle being parallel with the length/longest dimension of the rib 115. Other opening shapes and sizes may also be used for the electrolyte jet 125.

Figure 4N:
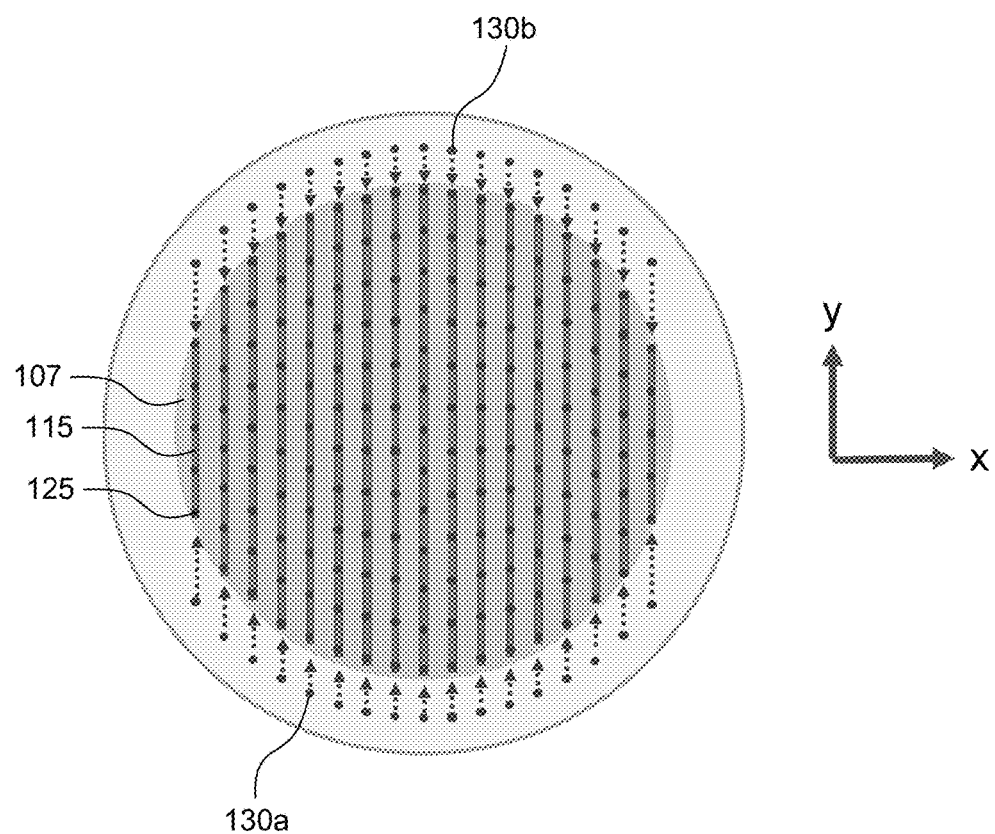
FIGS. 4N and 4O depict top down (FIG. 4N) and cross-sectional (FIG. 4O) views of an ionically resistive element that has ribs that include a plurality of electrolyte jets, showing the flow of electrolyte into the electrolyte jets.
Figure 4O:
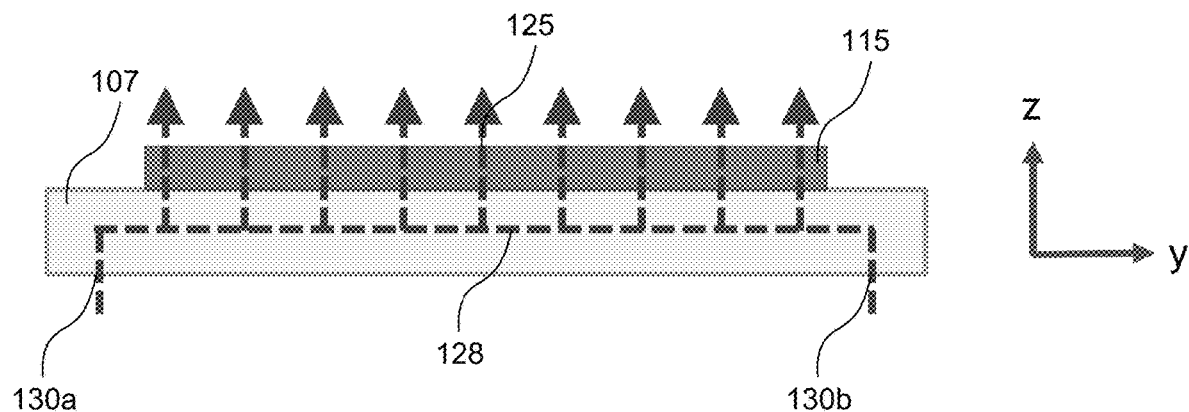

FIGS. 4N and 4O depict top down (FIG. 4N) and cross-sectional (FIG. 4O) views of an ionically resistive element 107 having ribs 115 that include electrolyte jets 125. These figures depict how electrolyte is delivered to and within the ribs/electrolyte jets according to certain embodiments. For the sake of clarity, the through-holes extending through the thickness of the ionically resistive element 107 (which deliver electrolyte from the ionically resistive element manifold, through the ionically resistive element, into the cross flow manifold) are omitted. In this example, each rib 115 includes a chamber 128 that extends along the length of the rib 115. A similar chamber 128 is shown extending into/out of the page in FIG. 4J. The chamber 128 delivers electrolyte to the plurality of electrolyte jets 125. In FIGS. 4N and 4O, the chamber 128 in each rib 115 is fed electrolyte from first electrolyte jet inlets 130a and second electrolyte jet inlets 130b. The first and second electrolyte jet inlets 130a and 130b are positioned on opposite ends of the ribs 115. In a similar embodiment, one set of the electrolyte jet inlets 130a or 130b may be replaced with electrolyte jet outlets that receive excess electrolyte flowing in the ribs 115 and deliver it to another channel or region within the electroplating apparatus (e.g., to a channel that receives the excess electrolyte and immediately removes it from the plating chamber, or to the ionically resistive element manifold, or to the cross flow manifold, etc.). The various electrolyte jet inlets 130a and 130b may be fed from one or more common electrolyte jet inlet manifolds (not shown) similar to a manifold that feeds various individual inlets in the side inlet 113. The electrolyte jet outlets, where used, may similarly feed to a connected manifold. The electrolyte jet inlet (and outlet) manifolds may be formed in the ionically resistive element 107, or in another component such as a membrane frame, a front side insert, a back side insert, or another piece of hardware positioned near the periphery of the ionically resistive element 107.

Figure 5A:
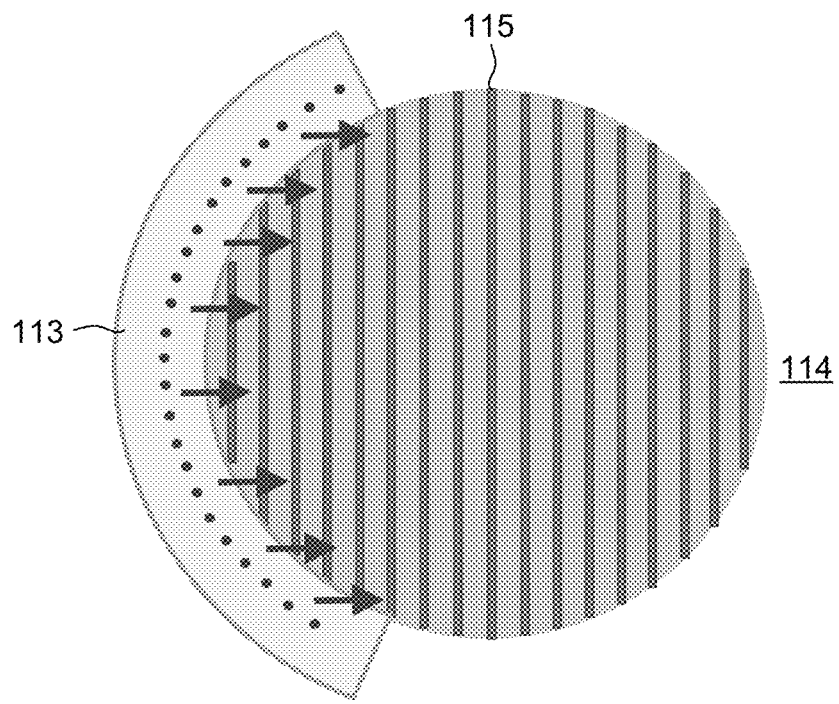
FIGS. 5A and 5B illustrate top-down views of ionically resistive elements having ribs thereon, where the ribs are oriented perpendicular to the direction of cross flowing electrolyte (FIG. 5A), or where the ribs are oriented parallel to the direction of cross flowing electrolyte (FIG. 5B).
Figure 5B:
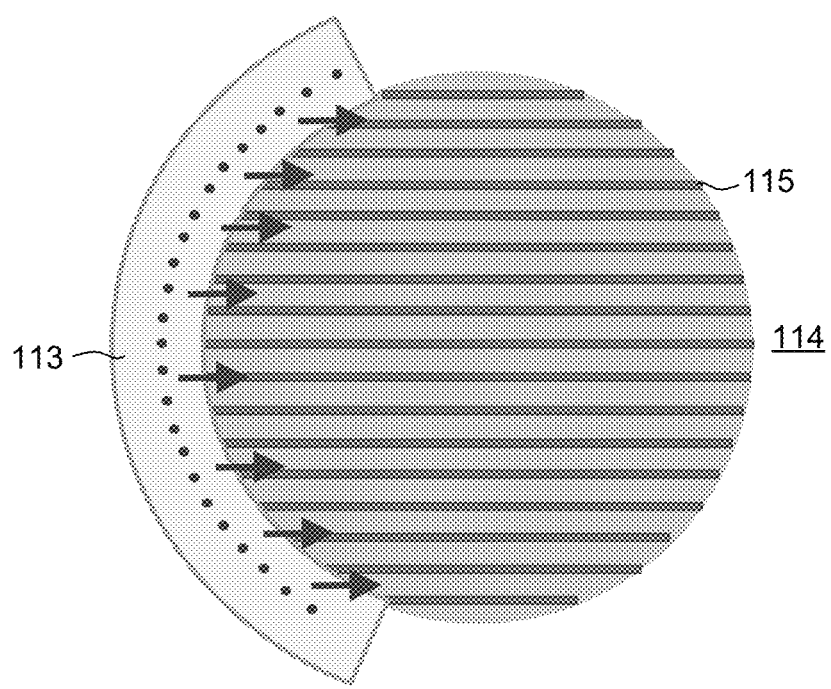

Various figures herein illustrate an ionically resistive element 107 having ribs 115 thereon, where the ribs are oriented such that their longest dimension (e.g., their length) is perpendicular to the direction of cross flowing electrolyte (e.g., perpendicular to the direction between the side inlet 113 and side outlet 114). FIG. 5A shows a top-down view of an ionically resistive element 107 with ribs 115 oriented in this manner. In some cases, the ribs 115 may be oriented differently. In the example shown in FIG. 5B, the ribs 115 are oriented parallel to the direction of cross flowing electrolyte. One advantage of the orientation shown in FIG. 5A is that the electrolyte must pass over each of the ribs 115 as it travels from the side inlet 113 to the side outlet 114. This achieves a high rate of electrolyte cross flow in the area above each rib 115. One advantage of the orientation shown in FIG. 5B is that the cross flow is unobstructed in the channels formed between adjacent ribs 115. Impinging flow can be delivered through electrolyte jets 125 (not shown in FIG. 5A or 5B) formed in the ribs 115. As a substrate is rotated, each portion of the substrate experiences cyclic exposure to (a) cross-flowing electrolyte (e.g., when above/proximate a channel formed between adjacent ribs 115), and (b) impinging electrolyte (e.g., when above/proximate a rib 115). This cyclic exposure is particularly pronounced when the ribs 115 are aligned with the direction of cross flow. Any of the embodiments described herein can be modified such that the ribs are oriented as shown in FIG. 5A.

Where an electrolyte conduit 122/electrolyte jet 125 are provided in combination with a valve that controls fluid delivery to the electrolyte conduit 122 and to the ionically resistive element manifold 111 (e.g., a valve at fluid junction 123), the number of flow patterns that can be achieved in the apparatus is substantially increased. With reference to Table 1, each of the flow patterns shown in the table can be achieved, e.g., by ensuring that the valve at fluid junction 123 allows delivery of electrolyte to the irrigation flute 116, but not to the electrolyte conduit 122. In addition, each flow pattern shown in the table can be modified to provide different flow patterns by (a) ensuring that the valve at fluid junction 123 allows delivery of electrolyte into electrolyte conduit 122, but not to irrigation flute 116; (b) ensuring that the valve at fluid junction 123 (if present) allows delivery of electrolyte into electrolyte conduit 122 and into irrigation flute 116; (c) partially opening the valve at fluid junction 123 to allow a reduced flow into either the electrolyte conduit 122 and/or irrigation flute 116, etc. Many different flow patterns and combinations of flow patterns can be used.

While FIGS. 3A and 4A illustrate valve 120 at a particular location within the electroplating apparatus, it is understood that such a valve may be provided at another location, so long as the valve is able to control the flow of electrolyte both above the ionically resistive element (e.g., through the side inlet 113) and below the ionically resistive element (e.g., into the ionically resistive element manifold 111, in some cases through the irrigation flute 116). Typically, the valve that controls these flows is located remote from the interior of the plating chamber. The location of valve 120 shown in FIGS. 3A and 4A is particularly useful because it is near both the side inlet 113 and the ionically resistive element manifold 111. As such, when the settings are changed on valve 120 (or a valve positioned at fluid junction 123, which is similarly near the relevant electrolyte flows), the electrolyte flows within the apparatus change very quickly. In cases where a relevant valve is positioned at a location that is farther away from the relevant portions of the apparatus, the electrolyte flows may respond more slowly to changes in the valve settings.

In some embodiments, it may be beneficial to favor one flow pattern or combination of flow patterns near the beginning of plating, and another flow pattern or combination of flow patterns near the end of plating. For example, recessed features having high aspect ratios may fill better under conditions where the electrolyte flow is dominated by cross flow, while recessed features having low aspect ratios may fill better under conditions where there is relatively greater impinging flow (e.g., such that the electrolyte flow is less dominated by cross flow). For at least these reasons, the optimal electrolyte flow pattern may change over the course of plating as the shape of the feature changes.

In various examples, a substrate having high aspect ratio features formed therein is plated under two different plating regimes. Each plating regime may utilize one or more flow patterns described herein. During the first plating regime (e.g., toward the beginning of plating), one or more flow patterns are used, at least one of which provides a relatively high degree of cross flowing electrolyte. During the second plating regime (e.g., toward the end of plating), one or more flow patterns are used, at least one of which provides a relatively lower degree of cross flowing electrolyte and/or a relatively greater degree of impinging electrolyte (as compared to the flow patterns used in the first flow regime).

Figure 7A:
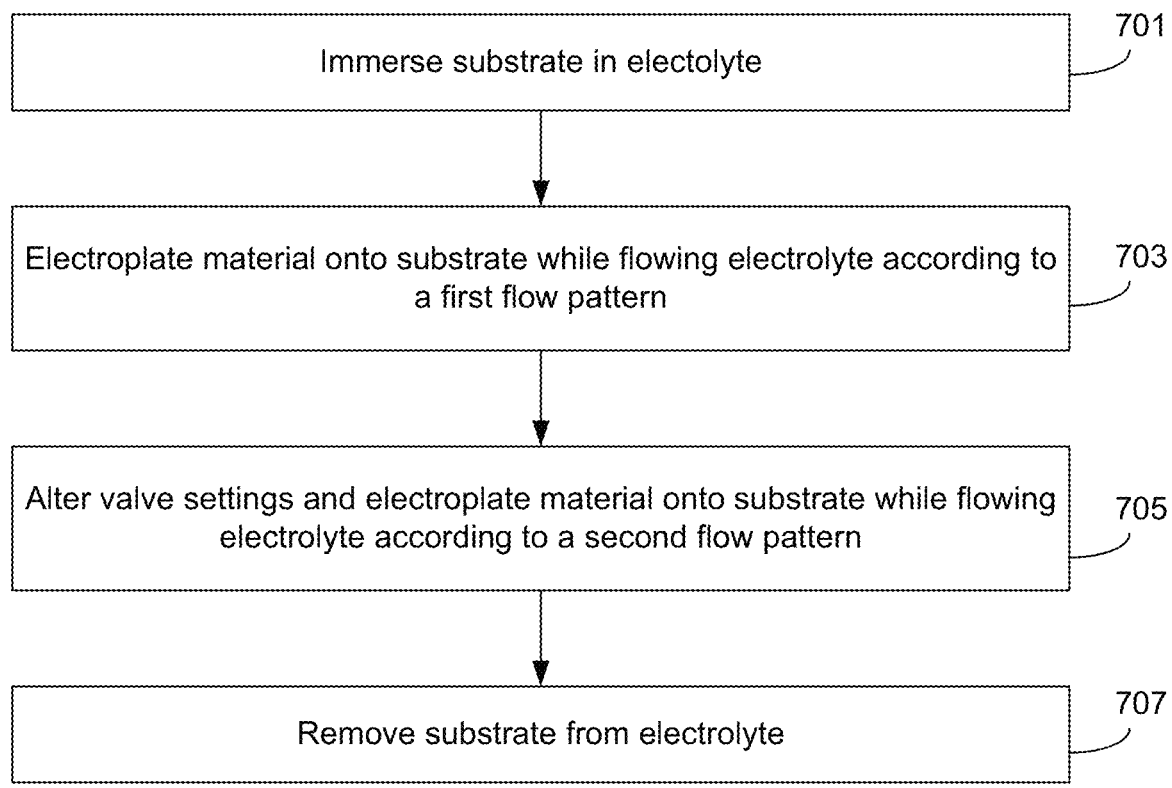
FIGS. 7A and 7B present flowcharts for methods of electroplating material onto a substrate according to various embodiments.

FIG. 7A presents a flowchart for a method of electroplating a substrate. The method begins at operation 701, where a substrate is immersed in electrolyte in an electroplating apparatus. The electroplating apparatus may be as shown in FIG. 3A or 4A in various embodiments. Next, at operation 703, material is electroplated onto the substrate while flowing electrolyte according to a first flow pattern. The flow pattern is determined by the geometry of the electroplating apparatus and the various valve and pump settings that control delivery of electrolyte to the electroplating apparatus. With reference to FIGS. 3A and 4A, the settings related to valve 120 and the settings related to a valve at fluid junction 123 (if present), are particularly relevant. After electroplating the material onto the substrate using the first flow pattern, the method continues at operation 705, where the valve settings are altered and material is electroplated onto the substrate while flowing electrolyte according to a second flow pattern. The second flow pattern is different from the first flow pattern due to the changed valve settings. Both the first flow pattern and the second flow pattern can be any flow pattern described herein, with electrolyte being delivered from the catholyte inlet 118 to any one or more of (a) the side inlet 113, (b) the ionically resistive element manifold 111, e.g., through irrigation flute 116, and (c) the electrolyte conduit 122/electrolyte jets 125. Increasing and/or decreasing any of these flows will change the flow pattern within the electroplating apparatus. In one example, the second flow pattern establishes a relatively greater degree of impinging flow at the substrate surface, and/or a relatively lower degree of cross flow at the substrate surface, compared to the first flow pattern. However, many combinations of flow patterns are possible. Next, at operation 707, the substrate is removed from electrolyte.

In a similar example, operations 703 and 705 may be cycled such that the first and second flow patterns are cyclically established in the electroplating apparatus during electroplating. In another example, additional flow patterns (e.g., a third flow pattern, a fourth flow pattern, etc.) may be established after operation 705 and before operation 707.

Figure 7B:
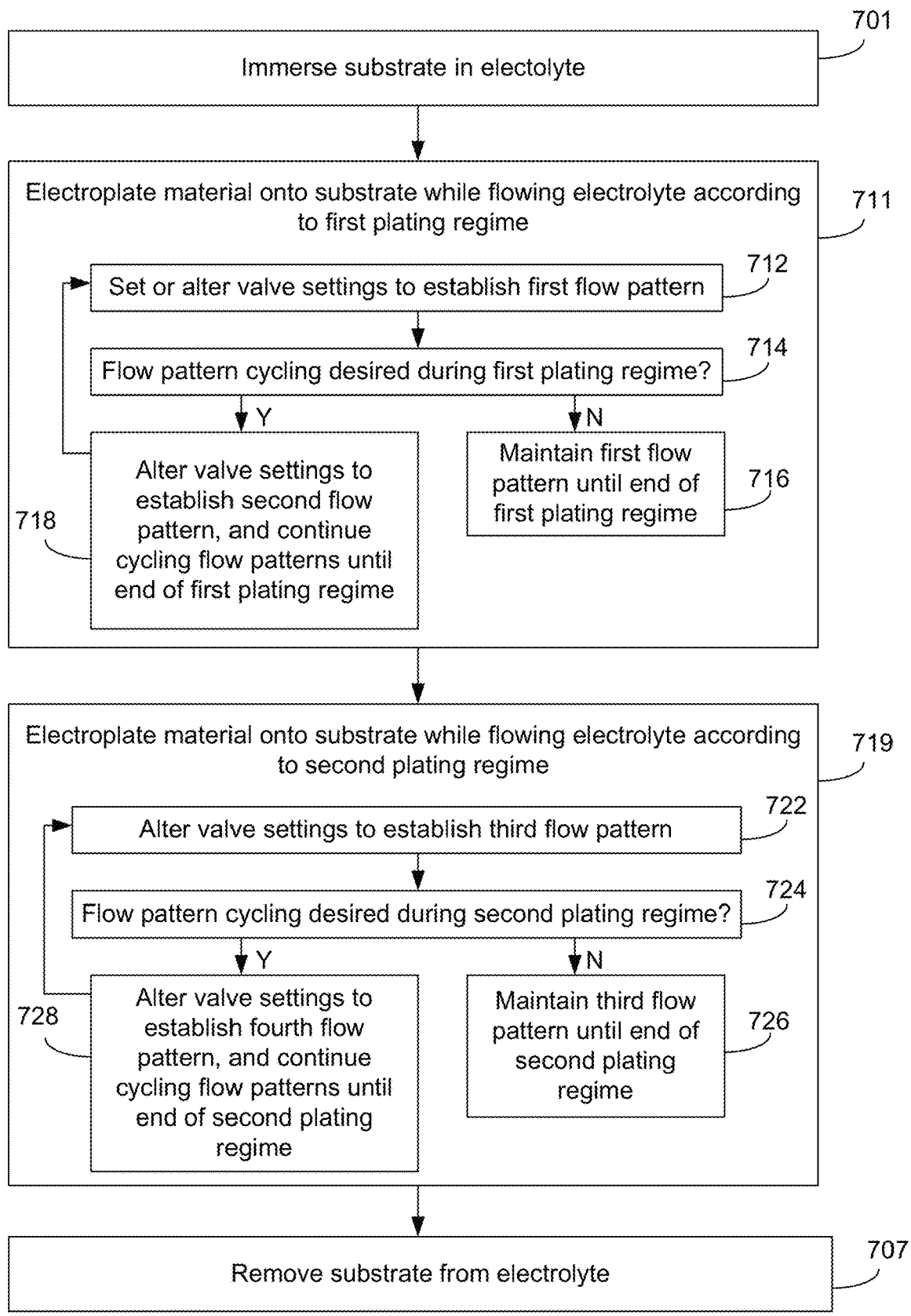

FIG. 7B presents another flowchart for a method of electroplating a substrate. In this example, two different plating regimes are used. During each plating regime, one or more flow patterns may be established within the electroplating apparatus. Where two or more flow patterns are used during a single plating regime, the flow patterns may be cycled together during the plating regime. The method begins at operation 701, where the substrate is immersed in electrolyte. Next, at operation 711 material is electroplated onto the substrate while flowing electrolyte according to a first plating regime. In order to accomplish operation 711, a number of steps may be taken. First, at step 712 the valve settings are set or altered to establish the first flow pattern. With reference to FIGS. 3A and 4A, the settings related to valve 120 and the settings related to a valve at fluid junction 123 (if present), are particularly relevant. Next, at step 714 it is determined whether flow pattern cycling is desired during the first plating regime. If no cycling is desired, the method continues with step 716, where the first flow pattern is maintained until the end of the first plating regime. In cases where cycling is desired, the method continues with operation 718, where the valve settings are altered to establish a second flow pattern. The first and second flow patterns are cycled together (e.g., by cycling the valve settings as needed) until the end of the first plating regime.

After the first plating regime is complete, the method continues at operation 719 by electroplating material onto the substrate while flowing electrolyte according to a second plating regime. In order to accomplish the second plating regime, a number of steps may be taken, similar to the first plating regime. At step 722, the valve settings are altered to establish a third flow pattern. At step 724, it is determined whether flow pattern cycling is desired during the second plating regime. If no cycling is desired, the method continues with step 726, where the third flow pattern is maintained until the end of the second plating regime. In cases where cycling is desired, the method continues with operation 728, where the valve settings are altered to establish a fourth flow pattern. The third and fourth flow patterns are cycled together (e.g., by cycling the valve settings as needed) until the end of the second plating regime. Next, at operation 707 the substrate is removed from the electrolyte.

While FIG. 7B shows only two plating regimes, any number of plating regimes may be used. Similarly, while FIG. 7B only shows up to two flow patterns during each plating regime, any number of flow patterns may be used during a single plating regime.

In cases where two or more flow patterns are used during a single plating regime, the flow patterns may switch repeatedly to cycle through the relevant flow patterns multiple times, as indicated by the arrows linking step 718 to step 712, and linking step 728 to step 722. In cases where the flow patterns are cycled within a single plating regime, the frequency at which the flow patterns are changed (e.g., the frequency at which one or more valves controlling the flow patterns are switched) may be between about 0.5-2 times per second, or between about 0.1-10 times per second. The duration spent in each flow pattern (e.g., the duration spent at each relevant set of valve settings) may be uniform or non-uniform, and may increase or decrease over time within a particular plating regime or between different plating regimes. In one example where a substrate is plated under a first plating regime that utilizes a first flow pattern, and then under a second plating regime that switches between a second flow pattern and a third flow pattern, the duration spent in each iteration of the second flow pattern may be shorter, longer, or the same duration spent in each iteration of the third flow pattern. The time at which one plating regime switches to another plating regime may be selected based on various characteristics including, but not limited to, the instant aspect ratio of the feature, the instant depth of the feature, the amount of charge or charge density passed to the substrate, etc. For instance, the process may switch from one plating regime to another when a threshold aspect ratio is reached, when a threshold feature depth is reached, when a threshold amount of charge or charge density is reached, etc. In one example, a first plating regime that provides relatively greater cross flow switches to a second plating regime that provides relatively greater impinging flow when the features on the substrate reach a threshold aspect ratio.

A particular example is described with reference to FIG. 3A. In this example, the substrate 102 is plated under two different plating regimes. During the first plating regime toward the beginning of plating, the valve 120a is fully open such that a high degree of cross flow is achieved. The valve 120b controlling delivery of electrolyte to the ionically resistive element manifold 111 through the irrigation flute 116 may be fully open, partly open, or closed. The high degree of cross flow helps fill the high aspect ratio features on the substrate 102. As the features are filled, their aspect ratio decreases, and it may be desirable to provide a greater degree of impinging flow. Thus, during the second plating regime toward the end of plating, the valve 120 is controlled to achieve a moderate or high degree of impinging flow, either constantly or periodically. For instance, during the second plating regime, the valve 120 may be controlled to achieve flow pattern 5 or 8 from Table 1 such that there is little or no cross flow and a moderate or high degree of impinging flow. In another example, during the second plating regime the valve 120 may be controlled to switch between (a) flow pattern 5 or 8 and (b) any of flow patterns 1-8. In another example, the apparatus of FIG. 4A is used, and at least one flow pattern achieved during the second plating regime involves delivering electrolyte through the electrolyte jets 125.

Electroplating Systems

The methods described herein may be performed by any suitable system/apparatus. A suitable apparatus includes hardware for accomplishing the process operations and a system controller having instructions for controlling process operations in accordance with the present embodiments. For example, in some embodiments, the hardware may include one or more process stations included in a process tool.

Figure 6:
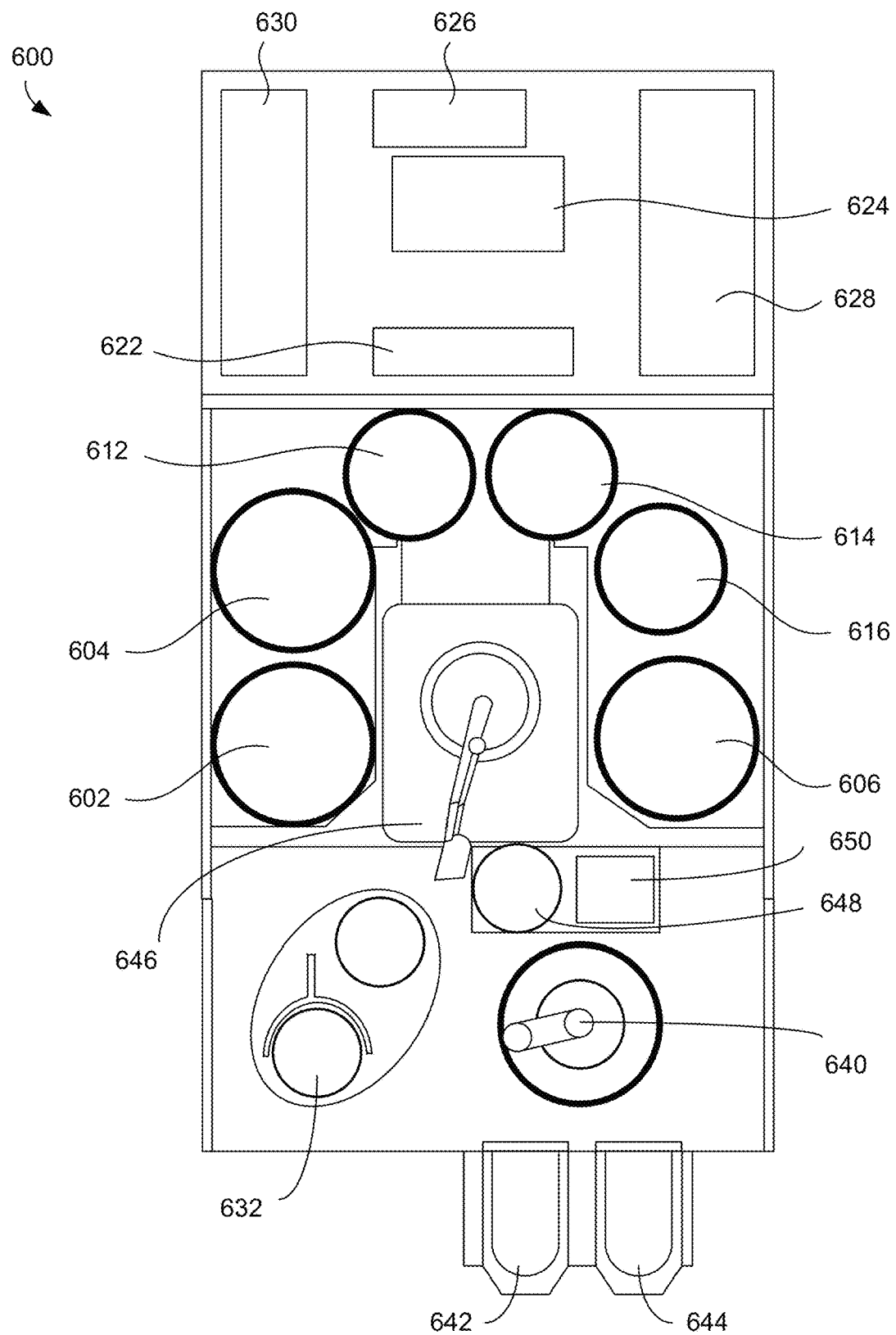
FIG. 6 depicts a simplified view of a multi-tool electroplating apparatus according to certain embodiments.

FIG. 6 shows a schematic of a top view of an example electrodeposition apparatus. The electrodeposition apparatus 600 can include three separate electroplating modules 602, 604, and 606. The electrodeposition apparatus 600 can also include three separate modules 612, 614, and 616 configured for various process operations. For example, in some embodiments, one or more of modules 612, 614, and 616 may be a spin rinse drying (SRD) module. In other embodiments, one or more of the modules 612, 614, and 616 may be post-electrofill modules (PEMs), each configured to perform a function, such as edge bevel removal, backside etching, and acid cleaning of substrates after they have been processed by one of the electroplating modules 602, 604, and 606.

The electrodeposition apparatus 600 includes a central electrodeposition chamber 624. The central electrodeposition chamber 624 is a chamber that holds the chemical solution used as the electroplating solution in the electroplating modules 602, 604, and 606. The electrodeposition apparatus 600 also includes a dosing system 626 that may store and deliver additives for the electroplating solution. A chemical dilution module 622 may store and mix chemicals to be used as an etchant. A filtration and pumping unit 628 may filter the electroplating solution for the central electrodeposition chamber 624 and pump it to the electroplating modules.

A system controller 630 provides electronic and interface controls required to operate the electrodeposition apparatus 600. The system controller 630 (which may include one or more physical or logical controllers) controls some or all of the properties of the electroplating apparatus 600.

Signals for monitoring the process may be provided by analog and/or digital input connections of the system controller 630 from various process tool sensors. The signals for controlling the process may be output on the analog and digital output connections of the process tool. Non-limiting examples of process tool sensors that may be monitored include mass flow controllers, pressure sensors (such as manometers), thermocouples, optical position sensors, etc. Appropriately programmed feedback and control algorithms may be used with data from these sensors to maintain process conditions.

A hand-off tool 640 may select a substrate from a substrate cassette such as the cassette 642 or the cassette 644. The cassettes 642 or 644 may be front opening unified pods (FOUPs). A FOUP is an enclosure designed to hold substrates securely and safely in a controlled environment and to allow the substrates to be removed for processing or measurement by tools equipped with appropriate load ports and robotic handling systems. The hand-off tool 640 may hold the substrate using a vacuum attachment or some other attaching mechanism.

The hand-off tool 640 may interface with a wafer handling station 632, the cassettes 642 or 644, a transfer station 650, or an aligner 648. From the transfer station 650, a hand-off tool 646 may gain access to the substrate. The transfer station 650 may be a slot or a position from and to which hand-off tools 640 and 646 may pass substrates without going through the aligner 648. In some embodiments, however, to ensure that a substrate is properly aligned on the hand-off tool 646 for precision delivery to an electroplating module, the hand-off tool 646 may align the substrate with an aligner 648. The hand-off tool 646 may also deliver a substrate to one of the electroplating modules 602, 604, or 606 or to one of the three separate modules 612, 614, and 616 configured for various process operations.

An example of a process operation according to the methods described above may proceed as follows: (1) electrodeposit copper or another material onto a substrate in the electroplating module 604; (2) rinse and dry the substrate in SRD in module 612; and, (3) perform edge bevel removal in module 614.

An apparatus configured to allow efficient cycling of substrates through sequential plating, rinsing, drying, and PEM process operations may be useful for implementations for use in a manufacturing environment. To accomplish this, the module 612 can be configured as a spin rinse dryer and an edge bevel removal chamber. With such a module 612, the substrate would only need to be transported between the electroplating module 604 and the module 612 for the copper plating and EBR operations. In some embodiments the methods described herein will be implemented in a system which comprises an electroplating apparatus and a stepper.

System Controller

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

What is claimed is:

1. An electroplating apparatus comprising:
    (a) a plating chamber configured to contain an electrolyte and an anode while electroplating metal onto a substrate, the substrate being substantially planar;
    (b) a substrate holder configured to support the substrate such that a plating face of the substrate is immersed in the electrolyte and separated from the anode during plating;
    (c) an ionically resistive element adapted to provide ionic transport through the ionically resistive element during electroplating, wherein the ionically resistive element comprises a plate that is at least about coextensive with the substrate and a plurality of through-holes formed in the plate;
    (d) an ionically resistive element manifold positioned below the ionically resistive element, wherein during electroplating electrolyte passes from the ionically resistive element manifold, through the through-holes in the ionically resistive element;
    (e) a cross flow manifold positioned above the ionically resistive element and below the plating face of the substrate, when the substrate is present in the substrate holder;
    (f) a side inlet for introducing electrolyte to the cross flow manifold;
    (g) a side outlet for receiving electrolyte flowing in the cross flow manifold, wherein the side inlet and side outlet are positioned proximate azimuthally opposing perimeter locations on the plating face of the substrate during electroplating, and wherein the side inlet and side outlet are adapted to generate cross-flowing electrolyte in the cross flow manifold during electroplating; and (h) a three way valve that controls delivery of electrolyte to each of (i) the side inlet and (ii) the ionically resistive element manifold.

2. The apparatus of claim 1, further comprising a controller configured to switch the three way valve during electroplating to provide at least a first flow pattern and a second flow pattern while electroplating on the substrate.

3. The apparatus of claim 2, wherein the second flow pattern provides a relatively greater degree of impinging electrolyte at the plating face of the substrate, as compared to the first flow pattern.

4. The apparatus of claim 1, wherein the three way valve permits independent control over delivery of electrolyte to the side inlet and to the ionically resistive element manifold.

5. The apparatus of claim 1, further comprising a controller configured to switch the three way valve during electroplating to provide at least a first plating regime and a second plating regime while electroplating on the substrate, wherein during the first plating regime, a first flow pattern is provided, wherein during the second plating regime, a second flow pattern and a third flow pattern are cyclically provided, and wherein the second flow pattern provides a relatively greater degree of impinging electrolyte on the plating face of the substrate, as compared to the first flow pattern.

6. The apparatus of claim 5, wherein the controller is configured to operate the three way valve such that (i) the first flow pattern delivers electrolyte to both the side inlet and to the ionically resistive element manifold, and (ii) the second flow pattern delivers electrolyte to the ionically resistive element manifold, but not to the side inlet.

7. The apparatus of claim 5, wherein the controller is configured to operate the three way valve such that the first flow pattern and second flow pattern each deliver electrolyte to both the side inlet and to the ionically resistive element manifold, wherein a flow of electrolyte to the side inlet is relatively greater in the first flow pattern compared to the second flow pattern, and wherein a flow of electrolyte to the ionically resistive element manifold is relatively greater in the second flow pattern compared to the first flow pattern.

8. The apparatus of claim 1, wherein the three way valve controls delivery of electrolyte to the side inlet and to the ionically resistive element manifold in a non-independent manner such that when a flow of electrolyte to the side inlet increases, a flow of electrolyte to the ionically resistive element manifold decreases, and vice versa.

9. The apparatus of claim 1, wherein the ionically resistive element comprises a plurality of ribs on an upper surface of the ionically resistive element, the ribs being linear and extending across the cross flow manifold.

10. The apparatus of claim 9, further comprising a plurality of electrolyte jets formed in the ribs on the ionically resistive element.

11. The apparatus of claim 10, wherein electrolyte delivered to the plurality of electrolyte jets is electrically isolated from the anode.

12. The apparatus of claim 11, further comprising a membrane frame for supporting a membrane that separates the anode from the substrate during electroplating, wherein the membrane frame defines a bottom surface of the ionically resistive element manifold, and further comprising an electrolyte conduit formed in the membrane frame and in the ionically resistive element, wherein the electrolyte conduit provides electrolyte to the plurality of electrolyte jets.

13. The apparatus of claim 12, further comprising a second three way valve that controls delivery of electrolyte to the ionically resistive element manifold and to the electrolyte conduit formed in the membrane frame and in the ionically resistive element.

\* \* \* \* \*